(12) United States Patent
Pirovano et al.

(10) Patent No.: US 12,349,371 B2
(45) Date of Patent: Jul. 1, 2025

(54) VERTICAL MEMORY ARCHITECTURE

(71) Applicant: Micron Technology, Inc., Boise, ID (US)

(72) Inventors: Agostino Pirovano, Milan (IT); Fabio Pellizzer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 742 days.

(21) Appl. No.: 17/651,217

(22) Filed: Feb. 15, 2022

(65) Prior Publication Data

US 2023/0262995 A1  Aug. 17, 2023

(51) Int. Cl.
*H01L 27/24* (2006.01)
*H01L 45/00* (2006.01)
*H10B 63/00* (2023.01)
*H10N 70/00* (2023.01)
*H10N 70/20* (2023.01)

(52) U.S. Cl.
CPC .......... *H10B 63/845* (2023.02); *H10B 63/34* (2023.02); *H10N 70/066* (2023.02); *H10N 70/231* (2023.02)

(58) Field of Classification Search
CPC ...... H10B 63/845; H10B 63/34; H10B 63/30; H10B 63/84; H10N 70/066; H10N 70/231; H10N 70/8825; H10N 70/20; H10N 70/823
See application file for complete search history.

(56) References Cited

U.S. PATENT DOCUMENTS 11,164,627 B2    11/2021  Pirovano et al.
2022/0051944 A1*  2/2022  Fantini ............... H10N 70/063
2022/0384722 A1* 12/2022  Graettinger ........ H10N 70/841

* cited by examiner

*Primary Examiner* — Jarrett J Stark
(74) *Attorney, Agent, or Firm* — Holland & Hart LLP

(57) ABSTRACT

Methods, systems, and devices for a vertical memory architecture are described. A memory device may include memory cells arranged in a three-dimensional vertical memory architecture. Each memory cell may include a storage element (e.g., a chalcogenide material), where a logic state may be programmed at the storage element based on a polarity of an applied voltage that exceeds a threshold voltage. The storage element may be coupled with a selection element and a conductive line. The selection element may be coupled with a bit line decoder and a word line decoder via vertical pillars. The selection element may selectively couple the storage element with the bit line decoder. In some examples, an activation voltage for the selection element may be less than a threshold voltage of the storage element.

10 Claims, 18 Drawing Sheets

VERTICAL MEMORY ARCHITECTURE

FIELD OF TECHNOLOGY

The following relates to one or more systems for memory, including a vertical memory architecture.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices (e.g., flash NOR and flash NAND memory devices), and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory cell architecture may store a logic state in a material (e.g., in a physical characteristic of the material), such as a chalcogenide, where the stored logic state is based on a polarity of a voltage applied across the material during a write operation. In some examples, the polarity used for programming may be accompanied by a particular behavior or characteristic of the material, such as a threshold voltage of the material, which may be used to detect a logic state stored by the memory cell (e.g., in a read operation). That is, to select a memory cell for an access operation (e.g., a write operation or a read operation), a memory device may apply a voltage that exceeds the threshold voltage. It may be beneficial to reduce a voltage for selecting memory cells, which may reduce an amount of energy used for storing or reading a logic state of a memory cell.

In accordance with examples described herein, a memory device may include memory cells arranged in a three-dimensional (3D) vertical memory architecture. Each memory cell may include a storage element (e.g., a chalcogenide material), where a logic state may be programmed based on a polarity of an applied voltage that exceeds a threshold voltage. The storage element may be coupled with a selection element (e.g., a transistor, such as a thin film transistor (TFT) or a metal-oxide-semiconductor field-effect transistor (MOSFET) device) and a conductive line (e.g., a plate line). The selection element may include a source contact decoded through a vertical pillar coupled with a bit line decoder (e.g., a digit line decoder), a gate contact decoded through a vertical pillar coupled with a word line decoder, and a drain contact coupled with the storage element. Based on a voltage applied to the gate contact, the selection element may selectively couple the storage element with a voltage source via the bit line decoder, where the programming voltage for the storage element may be a voltage difference between a voltage applied via the bit line decoder and a voltage applied via the conductive line. In some examples, an activation voltage for the selection element (e.g., the voltage applied to the gate contact) may be less than a threshold voltage of the storage element, and accordingly an energy to program a storage element in the memory architecture described herein may be less than an energy to program a storage element in other memory architectures, such as a 3D cross-point memory architecture.

Figure 1:
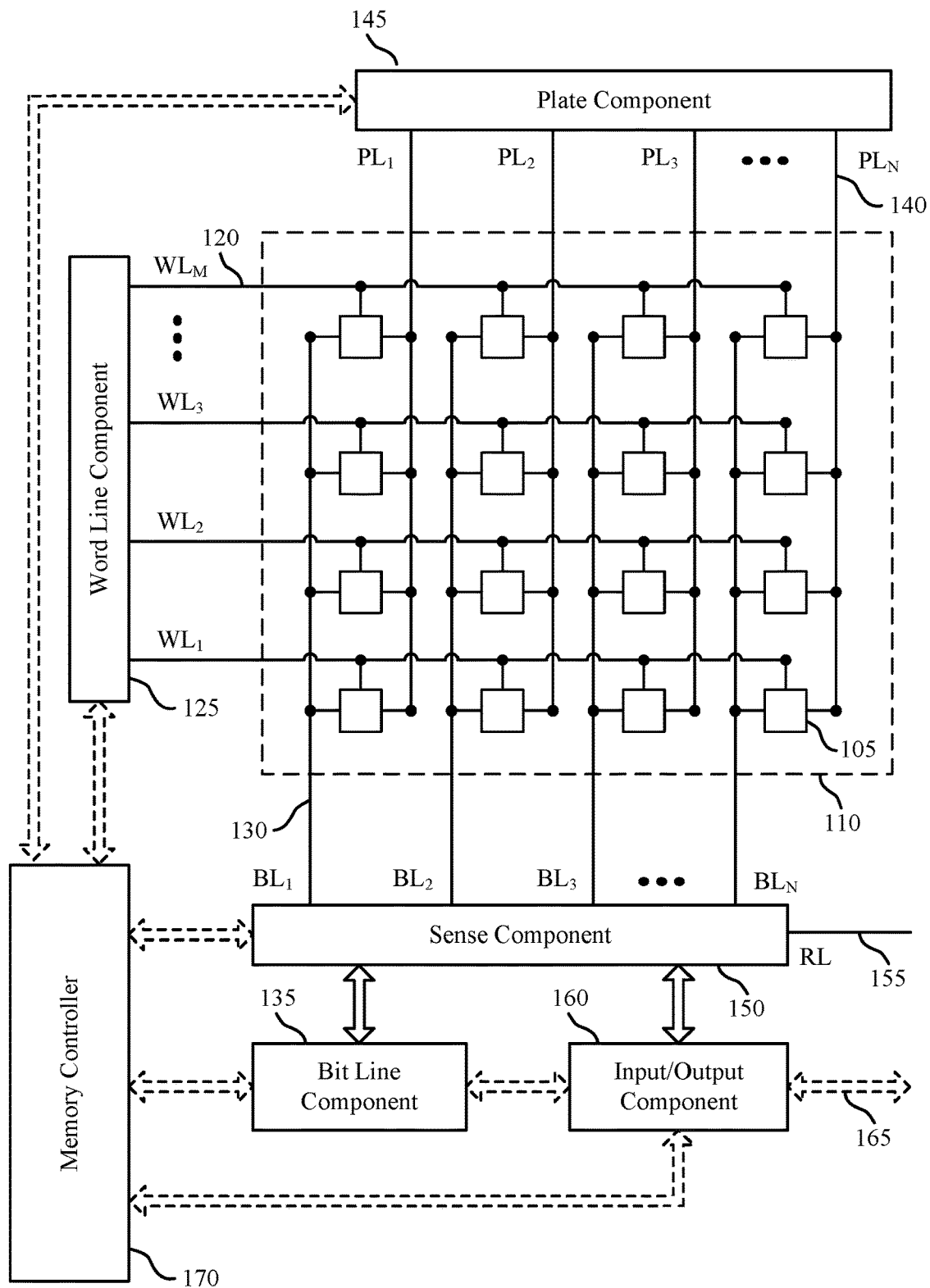
FIG. 1 illustrates an example of a memory device that supports a vertical memory architecture in accordance with examples as disclosed herein.
Figure 2:
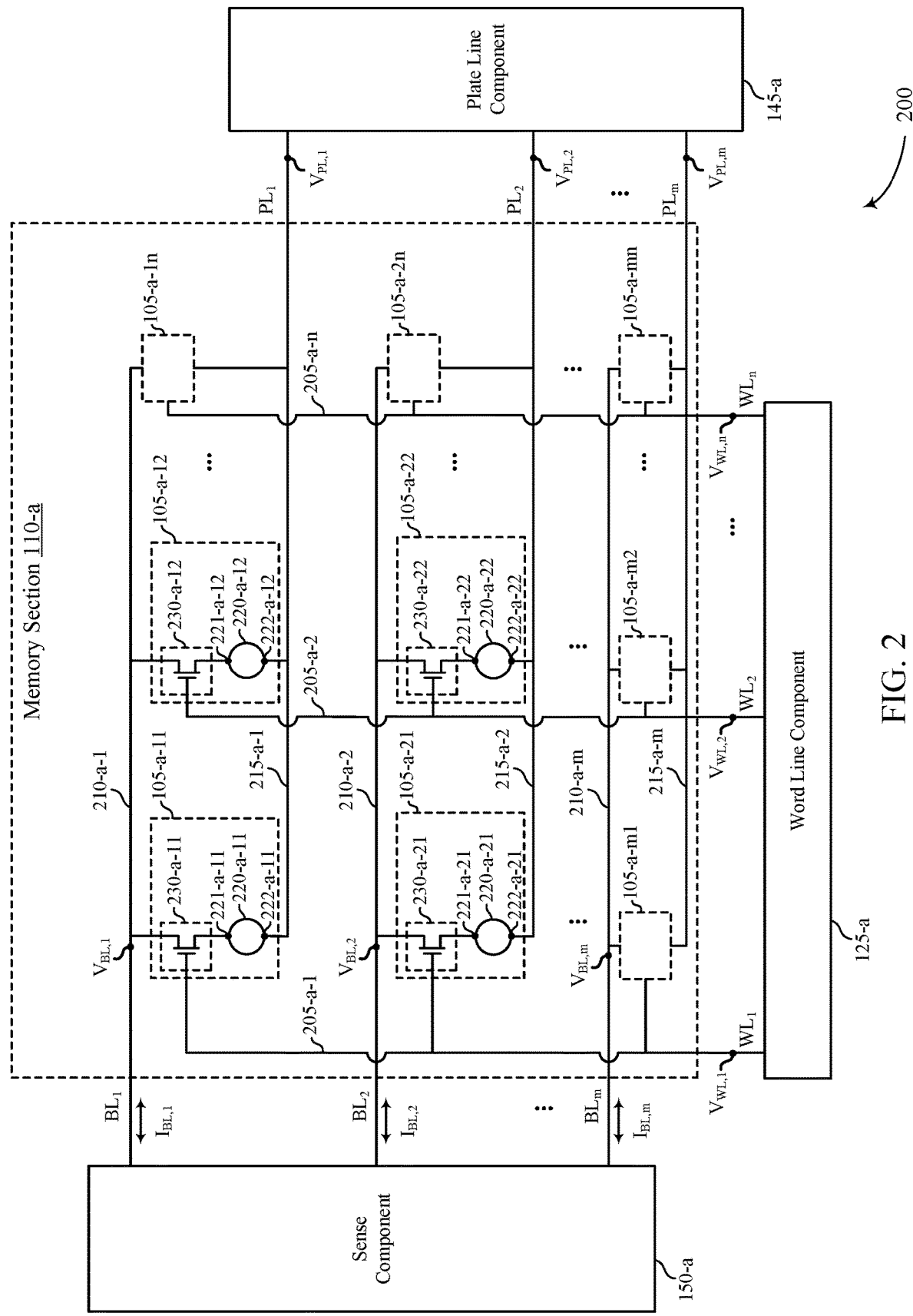
FIG. 2 illustrates an example of a circuit that supports a vertical memory architecture in accordance with examples as disclosed herein.

Features of the disclosure are initially described in the context of systems, devices, and circuits with reference to FIGS. 1 and 2. Features of the disclosure are described in the context of processing steps of a method for forming a vertical memory architecture with reference to FIGS. 3A-3N and a circuit with reference to FIG. 4. These and other features of the disclosure are further illustrated by and described in the context of a flowchart that relates to a vertical memory architecture with reference to FIG. 4.

FIG. 1 illustrates an example of a system 100 that supports a vertical memory architecture in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. The different logic states may be programmed to a particular memory cell 105 based at least in part on different voltage polarities applied to or across the memory cell 105 during a write operation.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common node (e.g., a common source node, a common source plate, a set of plate lines that are biased to a common voltage). Although a single memory section 110 of the memory device 100 is shown, various examples of a memory device in accordance with the present disclosure may have a set of more than one memory section 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In various examples, a memory cell 105 may include a material, which may be referred to as a memory element, a memory storage element, a material memory element, a material portion, a polarity-written material portion, and others. The material may have one or more variable and configurable characteristics that are representative of (e.g., correspond to) different logic states, which may include different electrical resistances, different threshold voltages, and others. For example, a material may take different forms, different atomic configurations or distributions, or otherwise maintain different characteristics based on a polarity of a voltage (e.g., an orientation of an electric field) across the material during a write operation, and such a material may have different electrical resistances or threshold characteristics depending on a polarity of a voltage during the write operation. In one example, a state of the material after a write operation with a positive voltage polarity may have a relatively low electrical resistance or threshold voltage, whereas a state of the material after a write operation with a negative voltage polarity may have a relatively high electrical resistance or threshold voltage. In some cases, a relatively high or low resistance or threshold voltage of a written memory cell 105 may be associated with or be otherwise based at least in part on a polarity of a voltage applied during a read operation. For example, a material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a material of a memory cell 105 may be associated with a threshold voltage. For example, electrical current may flow through the material when a voltage greater than the threshold voltage is applied across the memory cell 105, and electrical current may not flow through the material, or may flow through the material at a rate below some level (e.g., according to a leakage rate), when a voltage less than the threshold voltage is applied across the memory cell 105. Thus, a voltage applied to memory cells 105 may result in different current flow, or different perceived resistance, depending on whether a material portion of the memory cell 105 was written with a positive voltage polarity or a negative voltage polarity. Accordingly, the magnitude or other characteristic associated with the current that results from applying a read voltage to the memory cell 105 may be used to determine a logic state stored by memory cell 105.

In the example of memory device 100, a first set of memory cells 105 of the memory section 110 may be coupled with one of a set of first access lines 120 (e.g., a word line (WL), such as one of $WL_1$ through $WL_M$), and a second set of memory cells 105 may be coupled with one of a set of second access lines 130 (e.g., a bit line (BL), such as one of $BL_1$ through $BL_N$). The plurality of first access lines 120 may be coupled with a word line component 125, which may control various operations such as activating one or more of the plurality of first access lines 120, or selectively coupling one or more of the plurality of first access lines 120 with a voltage source or other circuit element. The plurality of second access lines 130 may be coupled with a sense component 150, which may support the detection of logic states stored by memory cells 105. In some examples, a sense component 150 may be in communication with a bit line component 135, or may include or be otherwise co-located with a bit line component 135, where a bit line component 135 may control various operations, such as activating one or more of the plurality of second access lines 130, or selectively coupling one or more of the plurality of second access lines 130 with a voltage source or other circuit element.

In some examples, a first set of memory cells 105 of a different memory section 110 may be coupled with one of a different plurality of first access lines 120 (e.g., a word line different than $WL_1$ through $WL_M$), and a second set of memory cells 105 of the different memory section 110 may be coupled with one of a different plurality of second access lines 130 (e.g., a bit line different than $BL_1$ through $BL_N$). In some cases, first access lines 120 and second access lines 130 may be coupled with the memory cells 105 via vertical pillars that are substantially parallel to one another in the memory device 100. References to word lines and bit lines, or their analogues, are interchangeable without loss of understanding or operation.

In general, one memory cell 105 may be coupled with a first access line 120 and a second access line 130. A target or selected memory cell 105 may be a memory cell 105 coupled with an energized or otherwise selected first access line 120 and an energized or otherwise selected second access line 130. In other words, a first access line 120 and a second access line 130 may be energized or otherwise selected to access (e.g., read, write, rewrite, refresh) a memory cell 105. Other memory cells 105 that are not coupled with both the first access line 120 and the second access line 130 may be referred to as non-target or non-selected memory cells 105.

The memory cells 105 of the memory section 110 may also be coupled with one of a plurality of third access lines 140 (e.g., a plate line (PL), such as one of $PL_1$ through $PL_N$). The plurality of third access lines 140 may be coupled with a plate component 145, which may control various operations such as activating one or more of the plurality of third access lines 140, or selectively coupling one or more of the plurality of third access lines 140 with a voltage source (e.g., a plate) or other circuit element. Although the plurality of third access lines 140 of the memory device 100 are shown as being parallel with the plurality of second access lines 130, in other examples, a plurality of third access lines 140 may be perpendicular to the plurality of first access lines 120 and the plurality of second access lines 130, or in any other configuration. For example, in the example of memory device 100, each of the third access lines 140 may correspond to a respective one of the second access lines 130. In another example, each of the third access lines 140 may correspond to a respective one of the first access lines 120.

Although illustrated as separate lines, in some examples, the plurality of third access lines 140 may represent or be otherwise functionally equivalent with a common plate line, a common source plate, or some other common node of the memory section 110 (e.g., a node common to each of the memory cells 105 in the memory section 110), or other common node of the memory device 100 (e.g., a node common to more than one memory section 110). In some examples, memory cells 105 of a different memory section 110 may be coupled with one of a different plurality of third access lines 140 (e.g., a set of plate lines different than $PL_1$ through $PL_N$, a different common plate line, a different common plate, a different common node), which may be electrically isolated and independently controllable from the illustrated third access lines 140 (e.g., plate lines $PL_1$ through $PL_N$).

In some architectures, the logic storing component (e.g., a material portion) of a memory cell 105 may be electrically coupled with or isolated from a respective second access line 130 by a selection element, which, in some examples, may be referred to as a cell selection component, a switching component, or a selector device. A selection element may be coupled with one or more of the first access lines 120 (e.g., via a control node or terminal of the selection element), which may be configured to control the selection element of or associated with the memory cell 105. For example, when the selection element of a memory cell 105 is a transistor, the first access line 120 may be coupled with a gate of the transistor (e.g., where a gate of the transistor may be a control node of the transistor), and the source and drain of the transistor (e.g., the nodes of the transistor that may be selectively coupled or isolated, the nodes of the transistor between which current may be selectively permitted or blocked) may be coupled with a second access line 130 or a material associated with the memory cell 105. Activating a first access line 120 may result in an electrical connection or closed circuit (e.g., a selective coupling) between the material of one or more memory cells 105 along the activated first access line 120 and their corresponding second access lines 130. Deactivating a first access line 120 may result in an isolation or open circuit (e.g., a selective isolation) between the material of one or more memory cells 105 along the deactivated first access line 120 and their corresponding second access lines 130. In some examples, current flowing through a material of a memory cell 105 (e.g., via a second access line 130, enabled by the selective activation of a selection element) may be used to read or write the material of the memory cell 105.

In some examples, a second access line 130 may provide access to one area (e.g., one side, one end) of the material of a memory cell 105, and a third access line 140 may provide access to another area (e.g., a different side, an opposite side, an opposite end) of the material of the memory cell 105. Thus, a second access line 130 and a third access line 140 may support applying voltage across a material portion of a memory cell 105 with different polarities (e.g., a first polarity when a voltage of a second access line 130 is higher than a voltage of a third access line 140, a second polarity when a voltage of a second access line 130 is lower than a voltage of a third access line 140). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a material portion storing a logic state may be selected, and the resulting flow of current via an access line (e.g., via a second access line 130), or lack thereof, may be detected, converted, or amplified to determine the programmed logic state stored by the memory cell 105.

Accessing memory cells 105 may be controlled through a word line component 125 (e.g., a word line decoder), a bit line component 135 (e.g., a bit line decoder), or a plate component 145 (e.g., a plate decoder), or a combination thereof. For example, a word line component 125 may receive a word line address from the memory controller 170 and select, activate, or bias the appropriate first access line 120 based on the received word line address. Similarly, a bit line component 135 may receive a bit line address from the memory controller 170 and select, activate, or bias the appropriate second access line 130. Thus, in some examples, a memory cell 105 may be accessed by selecting or activating a first access line 120 and a second access line 130. In some examples, such access operations may be accompanied by a plate component 145 selecting, activating, or biasing one or more of the third access lines 140 (e.g., biasing one of the third access lines 140 of the memory section 110, biasing the third access lines 140 of the memory section, biasing a common source plate of the memory section 110 or the memory device 100, biasing a common source node of the memory section 110 or the memory device 100). In various examples, any one or more of the word line component 125, the bit line component 135, or the plate component 145 may be referred to as, or otherwise include access line drivers or access line decoders.

In some examples, the memory controller 170 may control the operation (e.g., read operations, write operations, rewrite operations, refresh operations) of memory cells 105 through the various components (e.g., word line component 125, bit line component 135, plate component 145, sense component 150). In some cases, one or more of the word line component 125, the bit line component 135, the plate component 145, and the sense component 150 may be co-located or otherwise included with the memory controller 170. In some examples, one or more of the bit line component 135, the plate component 145, or the sense component 150 may be co-located (e.g., in common circuitry, in a common portion of the memory device 100). In some examples, any one or more of a word line component 125, a bit line component 135, or a plate component 145 may also be referred to as a memory controller or circuitry for performing access operations of the memory device 100. In some examples, any one or more of a word line component 125, a bit line component 135, or a plate component 145 may be described as controlling or performing operations for accessing a memory device 100, or controlling or performing operations for accessing the memory section 110 of the memory device 100.

The memory controller 170 may generate word line and bit line address signals to activate a target first access line 120 and second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single word line component 125, a single bit line component 135, and a single plate component 145, other examples of a memory device 100 may include different configurations to accommodate a memory section 110 or a set of memory sections 110. For example, in various memory devices 100 a word line component 125 may be shared among a set of memory sections 110 (e.g., having subcomponents common to all of the set of memory sections 110, having subcomponents dedicated to respective ones of the set of memory sections 110), or a word line component 125 may be dedicated to one memory section 110 of a set of memory sections 110. Likewise, in various memory devices 100, a bit line component 135 may be shared among a set of memory sections 110 (e.g., having subcomponents common to all of the set of memory sections 110, having subcomponents dedicated to respective ones of the set of memory sections 110), or a bit line component 135 may be dedicated to one memory section 110 of a set of memory sections 110. Additionally, in various memory devices 100, a plate component 145 may be shared among a set of memory sections 110 (e.g., having subcomponents common to all of the set of memory sections 110, having subcomponents dedicated to respective ones of the set of memory sections 110), or a plate component 145 may be dedicated to one memory section 110 of a set of memory sections 110.

A material of a memory cell 105 may be set or written or refreshed by biasing various combinations of the associated first access line 120, second access line 130, or third access line 140 (e.g., via a memory controller 170). In other words, a logic state may be stored in the material of a memory cell 105 (e.g., via a cell access signal, via a cell write signal). Word line component 125, bit line component 135, or plate component 145 may accept data, for example, via input/output component 160, to be written to the memory cells 105. In some examples, a write operation may be performed at least in part by a sense component 150, or a write operation may be configured to bypass a sense component 150 (e.g., being performed by a bit line component 135). The material of a memory cell 105 may be written with a logic state that is based at least in part on a polarity of a write voltage across the memory cell 105, which, in some examples, may be accompanied by a write current (e.g., based at least in part on the write voltage) or other heating of the memory cell.

A material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the bit line component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the material portion of a memory cell 105 may or may not permit electrical charge or current to flow via its corresponding access lines 130 or 140 (e.g., in response to a read voltage). Such charge or current may result from biasing, or applying a voltage, to the memory cell 105 from one or more voltage sources or supplies of the memory device 100, where voltage sources or supplies may be part of a word line component 125, a bit line component 135, a plate component 145, a sense component 150, a memory controller 170, or some other component (e.g., a biasing component). The described biasing may be supported by an activation of a selection element of a target memory cell 105, a deactivation of a selection element of a non-target memory cell 105, or both.

In some examples, when a read signal (e.g., a read pulse, a read current, a read voltage) is applied across a memory cell 105 with a material storing a first logic state (e.g., a logic 0, associated with a first write polarity), the memory cell 105 may conduct current due to the read pulse exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read pulse is applied to the memory cell 105 with the memory element storing a second logic state (e.g., a logic 1, associated with a second write polarity different than the first write polarity), the memory cell 105 may not conduct current due to the read pulse not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read pulse, but equal to or below an expected current through the memory cell 105 when the memory cell 105 does threshold in response to the read pulse. For example, the reference current may be higher than a leakage current of the associated access lines 130 or 140 (e.g., higher than a leakage current associated with one or more memory cells 105 coupled with an access line 130 or 140 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied during portions of a read operation). For example, if an applied read voltage does not result in current flow, one or more other read voltages or voltage polarities may be applied (e.g., until a current is detected by sense component 150). Based at least in part on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner, a predetermined sequence of read voltages that include different read voltage polarities) until a current is detected. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption due to a change in composition distribution of a logic storage material over time.

FIG. 2 illustrates an example of a circuit 200 that supports a vertical memory architecture in accordance with examples as disclosed herein. Components of the circuit 200 may be examples of the corresponding components described with reference to FIG. 1.

The circuit 200 may include a memory section 110-a including a set of memory cells 105-a (e.g., memory cells 105-a-11 through 105-a-mn). Each of the memory cells 105-a may be coupled with a word line 205-a of the memory section 110-a (e.g., one of word lines 205-a-1 through 205-a-n), a bit line 210-a of the memory section 110-a (e.g., one of bit lines 210-a-1 through 210-a-m), and a plate line 215-a of the memory section 110-a. Although illustrated as including a separate plate line 215-a for each set of memory cells 105-a (e.g., a separate plate line 215-a associated with each of the bit lines 210-a), in various examples, individual plate lines 215-a may be independently controlled or controllable. In some examples, the plate lines 215-a-1 through 215-a-m may collectively be illustrative of a common node or common source of the circuit 200 (e.g., a common source plate).

Each of the word lines 205-a (e.g., each of the word lines $WL_1$ through $WL_n$) may be associated with a respective word line voltage $V_{WL}$ as illustrated, and may be coupled with a word line component 125-a. The word line component 125-a may couple one or more of the word lines 205-a with various voltage sources. For example, the word line component 125-a may selectively couple one or more of the word lines 205-a with a voltage source having a relatively high voltage (e.g., a selection voltage, $V_{WL,H}$, which may be a voltage greater than 0V) or a voltage source having a relatively low voltage (e.g., a deselection voltage, $V_{WL,L}$, which may be a ground voltage of 0V, or a negative voltage).

Each of the bit lines 210-a (e.g., each of the bit lines $BL_1$ through $BL_m$) may be associated with a respective bit line voltage $V_{BL}$ as illustrated, and may be coupled with a sense component 150-a. In the example of circuit 200, each of the bit lines 210-a are illustrated as direct connections between the memory section 110-a and the sense component 150-a (e.g., directly coupling the memory section 110-a with the sense component 150-a). In other examples of circuits that support the described access schemes or operations, additional components or elements may be coupled with or between a memory section 110 and a sense component 150. In some examples, the sense component 150-a may selectively couple one or more of the bit lines 210-a with a voltage source having a relatively high voltage (e.g., a high bit line voltage, $V_{BL,H}$, which may be a voltage greater than 0V) or a voltage source having a relatively low voltage (e.g., a low bit line voltage, $V_{BL,L}$, which may be a ground voltage of 0V, or a negative voltage).

Each of the plate lines 215-a (e.g., each of the plate lines $PL_1$ through $PL_m$) may be associated with a respective plate line voltage $V_{PL}$ as illustrated, and may be coupled with a plate component 145-*a*. The plate component 145-*a* may couple one or more plate lines 215-*a* with various voltage sources. For example, the plate component 145-*a* may selectively couple one or more plate lines 215-*a* with a voltage source having a relatively high voltage (e.g., a plate high voltage, $V_{PL,H}$, which may be a voltage greater than 0V) or a voltage source having a relatively low voltage (e.g., a plate low voltage, $V_{PL,L}$, which may be a ground voltage of 0V, or a negative voltage).

According to the example illustrated by circuit 200, memory cells 105-*a*-11 through 105-*a*-1*n* may represent a set of memory cells 105-*a* of the memory section 110-*a* that are coupled with or between a bit line of the memory section 110-*a* (e.g., bit line 210-*a*-1) and a plate line of the memory section 110-*a* (e.g., plate line 215-*a*-1). Further, memory cells 105-*a*-*m*1 through 105-*a*-*mn* may represent a set of memory cells 105-*a* of the memory section 110-*a* that are coupled with or between a different bit line of the memory section 110-*a* (e.g., bit line 210-*a*-*m*) and a different plate line of the memory section 110-*a* (e.g., plate line 215-*a*-*m*).

According to the example illustrated by circuit 200, memory cells 105-*a*-11 through 105-*a*-*m*1 may represent a set of memory cells 105-*a* of the memory section 110-*a* that are coupled with a word line of the memory section 110-*a* (e.g., word line 205-*a*-1). Further, memory cells 105-*a*-1*n* through 105-*a*-*mn* may represent a set of memory cells 105-*a* of the memory section 110-*a* that are coupled with a different word line of the memory section 110-*a* (e.g., word line 205-*a*-*n*).

In the example of circuit 200, each of the memory cells 105-*a* include a respective storage element 220-*a* and a respective selection element 230-*a*. The plurality of memory cells 105-*a* may illustrate an example where each memory cell 105-*a* includes a storage element 220-*a* coupled with one of a first plurality of access lines (e.g., one of the plate lines 215-*a*) and a selection element 230-*a* configured to selectively couple the storage element 220-*a* with one of a second plurality of access lines (e.g., one of the bit lines 210-*a*) based at least in part on a voltage of one of a third plurality of access lines (e.g., one of the word lines 205-*a*). In other words, the memory cells 105-*a* each include a storage element 220-*a* that is configured to be selectively coupled with, or isolated from, an access line (e.g., a bit line 210-*a*) in response to a signal (e.g., as carried by a word line 205-*a*). Although the memory cells 105-*a* are illustrated with storage elements 220-*a* coupled with a plate line 215-*a* and a selection element 230-*a* coupled with a bit line 210-*a*, the order of these components may be swapped in other examples of the described memory cell architectures such that a memory cell may include a storage element 220 coupled with a plate line 215 and a selection element 230 coupled with a bit line.

In some examples, the storage elements 220-*a* include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms. In some examples, some or all of the set of logic states supported by the memory cells 105-*a* may be associated with an amorphous state of the storage elements 220-*a*.

In some examples, an electrode may be coupled with a storage element 220-*a* (e.g., between a storage element 220-*a* and a corresponding selection element 230-*a*, between a storage element 220-*a* and a corresponding plate line 215). The term electrode may refer to an electrical conductor, or other electrical interface between components, and in some cases, may be employed as an electrical contact to a storage element 220-*a*. An electrode may include a trace, wire, conductive line, conductive layer, conductive pad, or the like, that provides a conductive path between elements or components of the circuit 200. In some examples, an electrode may be formed of a different material than a storage element 220-*a* and an interfacing component, which may reduce atomic diffusion or interaction between the storage element 220-*a* and an interfacing component, or may provide other benefits. For example, an electrode may be formed from a different material than a chalcogenide (e.g., carbon), and may prevent chemical interaction between the chalcogenide of a storage element 220-*a* and a plate line 215-*a* or selection element 230-*a*. In some examples, the described electrodes may be omitted, such that the storage element 220-*a* may be in direct contact with, or otherwise formed of a material continuously with one or both of a plate line 215-*a* or a selection element 230-*a*.

The material used in the storage elements 220-*a* may be based on an alloy, such as the alloys listed above, and may be configured to avoid a phase change during normal operation of the circuit 200 (e.g., due to the composition of the chalcogenide material, due to operational voltages and currents configured to maintain the chalcogenide material in a single phase, such as an amorphous or glass phase). For example, the chalcogenide material may include a chemical element, such as arsenic, that inhibits crystallization of the chalcogenide material. Thus, the storage elements 220-*a* may remain in an amorphous state during the operation of the circuit 200. In other words, some or all of the logic states that may be stored by the storage elements 220-*a* may correspond to an amorphous state of the respective storage element 220-*a*.

The storage elements 220-*a* may be configured to store one of a set of logic states based at least in part on a polarity of a write voltage applied to the material. A voltage polarity across a storage element 220-*a* may be described with reference to a corresponding first node 221-*a* and a second node 222-*a* of the storage element 220-*a*. In some examples, a positive voltage polarity across a storage element 220-*a* may refer to a condition where a voltage at a corresponding first node 221-*a* is higher than a voltage of a corresponding second node 222-*a*, and a negative voltage polarity across a storage element 220-*a* may refer to a condition where a voltage at a corresponding first node 221-*a* is lower than a voltage of a corresponding second node 222-*a*. However, different directions or orientations may be used to describe a voltage polarity applied to a storage element 220-*a*.

By way of example, and without limiting the disclosure or the claims to such a physical phenomenon or interpretation thereof, when a particular memory cell 105 is programmed, elements within the corresponding storage element 220-*a* may separate, causing ion or other compositional migration or anisotropy. In some examples, a write operation on a memory cell 105-*a* may result in a directional anisotropy of a corresponding storage element 220-*a* between a first node 221-*a* and a second node 222-*a* (e.g., along a direction between the first node 221-*a* and the second node 222-*a*). For example, ions or other constituents of a storage element 220-*a* may migrate towards a particular node, depending on the polarity of the write voltage applied to the memory cell 105-*a*. In some examples, certain constituents of a storage element 220-*a* may migrate towards the relatively negative electrode.

In some examples, compositional migration may be supported at least in part by applied heating of a storage element 220-*a*, which may be provided by ohmic heating resulting from a current through the storage element 220-*a*. In some examples, such current may be responsive to, or otherwise based at least in part on a write voltage (e.g., in a direction through the material that is based at least in part on the polarity of applied voltage). The compositional migration of the storage element 220-*a* may occur while the maintaining a largely amorphous atomic arrangement (e.g., a relatively random structural arrangement of molecules, as compared to a relatively ordered structural arrangement such as a crystalline arrangement). Although described in the context of compositional distributions or anisotropy in a storage element 220-*a* for distinguishing one logic state of a memory cell 105-*a* from another logic state, other mechanisms or material characteristics for storing logic states based on write operation polarity may support the described architectures for polarity-written memory cells 105-*a*.

Without limiting the disclosure or the claims to such a physical phenomenon or interpretation thereof, depending on the defined or configured directionality of the memory cell 105-*a*, a concentration of migrating ions towards one node or another may represent a logic "1" or logic "0" state. The memory cell 105-*a* may then be read by applying a voltage across the storage element 220-*a* to sense the logic state stored by the memory cell 105-*a*. In some examples, a threshold voltage (e.g., as experienced during a read operation) may be based on the distribution of ions in the storage element 220-*a* and the polarity of an applied read pulse. For example, if a storage element 220-*a* has a given distribution of ions, the threshold voltage detected during a read operation may be different for a first read pulse with a first polarity than it is with a second read pulse having a second polarity. In another example, rather than detecting a particular threshold voltage of a storage element 220-*a*, a voltage between predicted threshold voltages of different logic states may be applied in a read operation, and a presence or absence of current through the storage element 220-*a* may be used to detect whether the storage element 220-*a* was written with one polarity or another. It is to be understood that, whether a result of compositional distributions or anisotropy (e.g., ion migration, etc.) or any other underlying mechanism, aspects related to the writing (programming, inducing, imposing, configuring, or otherwise creating) and reading (detecting, determining, or otherwise observing) of different logic states based at least in part on different threshold voltages of a material and the application of voltages having different polarities may occur and be supported in accordance with the structures and techniques described herein. In various examples in accordance with the present disclosure, one or more other physical phenomenon may be relevant to logic states written to, or detected from the described memory cells 105, and the teachings herein may relate more generally to polarity-based memory cells and their operation, without limitation to any particular physical phenomena that may underlie the described behavior of such memory cells 105.

The word line component 125-*a*, the sense component 150-*a*, and the plate component 145-*a* may be configured to support various access operations (e.g., read operations, write operations, rewrite operations, refresh operations, and others) for the memory section 110-*a*. For example, the word line component 125-*a* may be configured to select, activate, or otherwise apply a voltage to particular word lines 205-*a*. In some examples, selecting or activating a word line 205-*a* may select or activate the selection element 230-*a* for one or more of the memory cells 105-*a* that are coupled with the respective word line 205-*a*. For example, activating the word line 205-*a*-1 may select or activate some or all of the selection elements 230-*a*-11 through 230-*a*-*m*1 associated with memory cells 105-*a*-11 through 105-*a*-*m*1 (e.g., a set of memory cells 105-*a* of the memory section 110-*a*). Although in some examples it may be advantageous to use n-channel transistors for the selection elements 230-*a*, in various examples the selection elements 230-*a* may include n-channel transistors, p-channel transistors, or other switching components, and the described operations for accessing a memory cell 105-*a* may be modified accordingly.

In some examples, the plate component 145-*a* may be configured to select, activate, or otherwise apply a voltage to one or more of the plate lines 215-*a*, and the sense component 150-*a* may be configured to select, activate, or otherwise apply a voltage to one or more of the bit lines 210-*a*. In some examples, the plate component 145-*a* and the sense component 150-*a* may operate cooperatively to apply a voltage across particular memory cells 105-*a* according to a desired voltage magnitude or voltage polarity. In some examples, operations associated with the word line component 125-*a*, the plate component 145-*a*, or the sense component 150-*a* may be controlled at least in part by a memory controller 170.

The sense component 150-*a* may include various components configured to detect a logic state stored by respective ones of the memory cells 105-*a*, which may be based at least in part on a current IBL flows along a respective bit line 210-*a* in response to a voltage applied across a memory cell 105-*a* (e.g., a voltage between a bit line 210-*a* and a plate line 215-*a*). In some examples, the sense component 150-*a* may detect a stored logic state by comparing a current (e.g., a current IBL) flowing along a respective bit line 210-*a* to a reference current or other threshold, or comparing a voltage associated with such a current (e.g., a voltage across a shunt resistor carrying a current IBL) to a reference voltage or other threshold. In some examples, the sense component 150-*a* may detect a stored logic state by determining whether a memory cell 105-*a* (e.g., a storage element 220-*a*) has thresholded. For example, the sense component 150-*a* may be configured to detect when a storage element 220-*a* has undergone a change in resistance state, such as a breakdown from a high resistance state to a low resistance state.

The sense component 150-*a* may, in some examples, be used to latch signals associated with a read operation when detecting a logic state stored by memory cells 105-*a*. Electrical signals associated with such latching may be communicated between the sense component 150-*a* and an input/output component 160. In some examples, the sense component 150-*a* may be in electronic communication with a memory controller, such as a memory controller 170 described with reference to FIG. 1, which may control various operations of the sense component 150-*a*.

The described architectures for memory cells 105-*a* may provide various advantages. For example, by including a storage element 220-*a* to store a logic state based on a material characteristic (e.g., a physical or compositional characteristic that may be written based at least in part on a write voltage polarity, such a compositional distribution or other anisotropy, or a difference in threshold characteristics), the memory portion 220-a may provide aspects of non-volatile storage that are not provided by capacitive or other charge-storage-based memory architectures.

As another example, maintaining the storage elements 220-a in an amorphous state (e.g., a glass state, a relatively disordered molecular arrangement) for different logic states, the storage elements 220-a may reduce the amount of heating (e.g., lower current) or time to write logic states. For example, changing the phase of a material (e.g., as in some phase change memory architectures) may demand enough current through a memory cell to form an amorphous state, whether the corresponding material was already in an amorphous state or was previously in a crystalline state. In one example, such phase change may call for in the range of 500-600 microamps of current, whereas a corresponding write operation of a memory cell 105-a may call for in the range of 20-30 microamps of current, which may be as low as a shutoff current (e.g., an $I_{hold}$) associated with a thresholding characteristic of the storage elements 220-a.

The relatively high current of phase change operation and some related memory architectures may be a concern not only because of the related power consumption, but also because of the relatively large, high-capacity transistors that may be used for cell selection at such currents, and the related cost and layout limitations of such high-capacity (e.g., high voltage or current tolerance) transistors. In the case of the described architectures for polarity-written cells, the selection elements 230-a may be significantly reduced, due to the relatively low currents associated with accessing the memory cells 105-a (e.g., when the storage elements 220-a are maintained in an amorphous state).

As another example, forming different phases corresponding to different logic states may include, as part of a write operation, placing a material into an amorphous state and then controlling a rate of cooling of the material. In some examples, forming a crystalline state may include relatively slow cooling, and such an operation may not be required for writing a memory cell 105-a as described herein. Further, in some cases, the forming of different phases of a material may be associated with (e.g., may cause over time) degradation of the material, and thus, by avoiding such degradation (e.g., because the storage elements 220-a remain in an amorphous state), the memory cells 105-a of the described memory architectures may be associated with improved endurance characteristics when compared to at least some memory architectures.

As another example, the inclusion of a selection element 230-a may support the storage elements 220-a being designed or configured to operate with lower access voltages (e.g., for read operations or write operations) than if selection element 230-a was not present (e.g., as in some phase change or other memory architectures). For example, memory architectures without a dedicated selection component (e.g., separate from a storage component) may have leakage current through non-target memory cells (e.g., non-target memory cells sharing an activated access line with a target memory cell), or inadvertent selection of a non-target cell (e.g., due to thresholding of a non-target cell) where such leakage or inadvertent selection currents may be indeterminate from a current through a target cell used for sensing a stored logic state. Further, such memory architectures may also have possible effects of logic state degradation in non-target memory cells. Thus, to support operable read or write margins, such self-selecting memory architectures may command relatively high voltages (e.g., in the range of 10 V) for certain access operations (e.g., for writing a storage element with self-selecting properties and logic storage properties). Accordingly, such self-selecting memory architectures may command special-purpose voltage sources or other circuitry, which may be associated with elevated costs or power consumption.

In the described architecture for polarity-written memory cells 105-a, selection elements 230-a may be used to selectively couple or isolate storage elements 220-a. Such an architecture may reduce or eliminate leakage currents or inadvertent selection or thresholding that would otherwise be associated with non-target memory cells 105-a, and may also reduce sensitivity to degradation of stored logic states (e.g., resulting from access voltages associated with other target memory cells 105-a that share a common plate line 215 or bit line 210). Thus, the memory cells 105-a may support suitable read or write margins (e.g., a positive read window budget) at relatively low voltages for access operations, such as voltages in the range of 3V across the memory cells 105-a, and even as low as 1 V (e.g., for biasing word lines 205-a, for activating selection elements 230-a). In other words, the storage elements 220-a may be engineered for a relatively low threshold voltage (e.g., $V_{th}$) of the storage elements 220-a to support relatively low-voltage operation, while the selection elements 230-a may be used (e.g., via array decoding) to selectively isolate non-target memory cells to reduce or eliminate leakage currents or inadvertent thresholding of non-target memory cells 105-a that would otherwise lead to difficulties in resolving or detecting a logic state stored by a target memory cell 105-a. Thus, the memory cells 105-a may be operated in a manner that avoids, or otherwise does not rely (at least not exclusively) on a self-selecting behavior of a memory material.

Thus, for these and other reasons, a memory cell 105-a that includes the described combination of a storage element 220-a and a selection element 230-a may provide advantages over other memory architectures (e.g., a 3D cross-point memory architecture).

Although the memory section 110-a, the memory cells 105-a, and the selection elements 230-a are illustrated with respective dashed lines as reflecting particular boundaries, such boundaries are shown for illustrative purposes only. In other words, one or more of the memory section 110-a, the memory cells 105-a, or the selection elements 230-a may have boundaries different than the dashed boundaries shown in the circuit 200, and accordingly may include more or fewer components than illustrated in the example of FIG. 2.

Figure 3A:
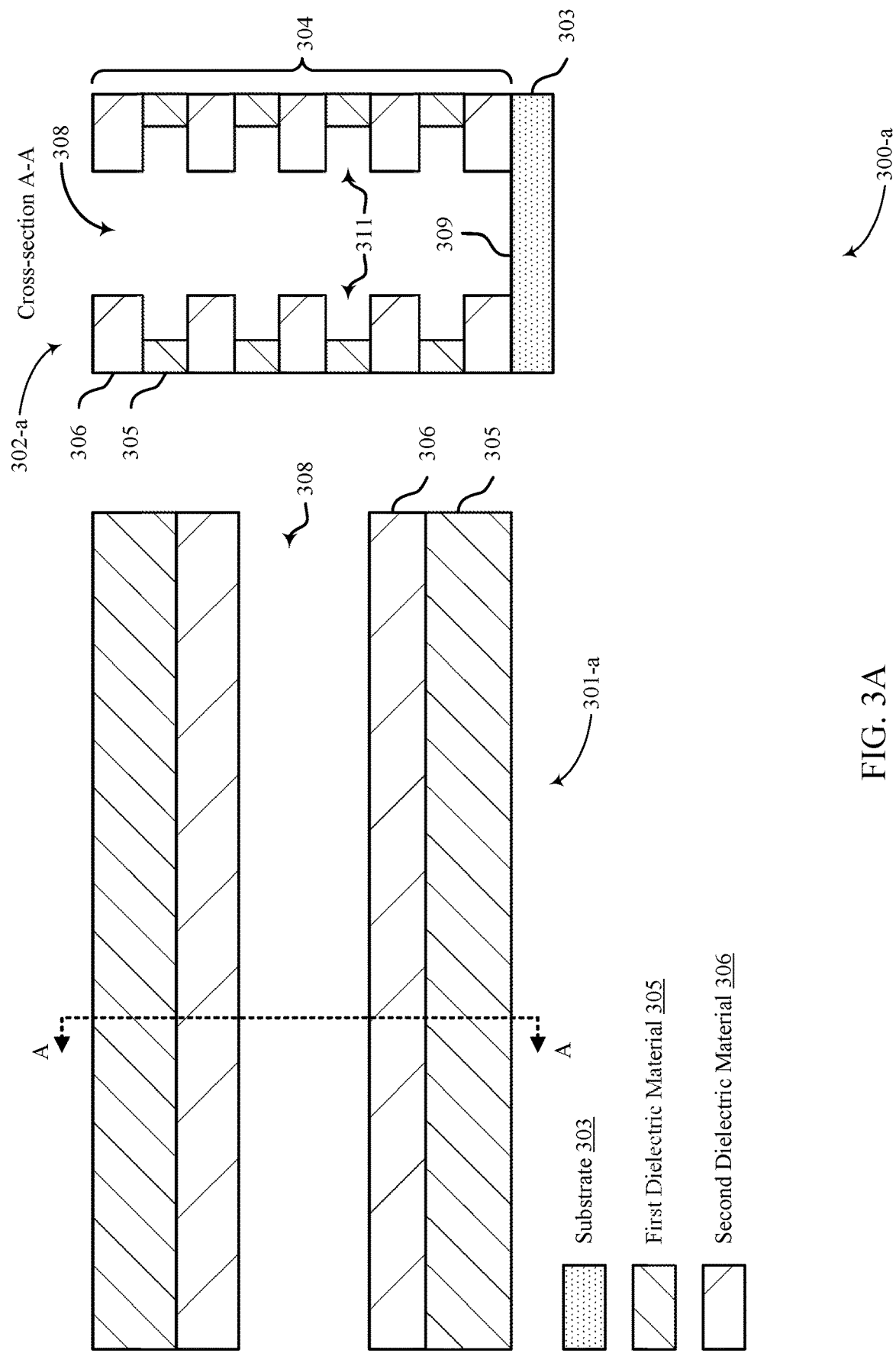
FIGS. 3A-3N illustrate examples of processing steps of a method for forming a vertical memory architecture in accordance with examples as disclosed herein.
Figure 3B:
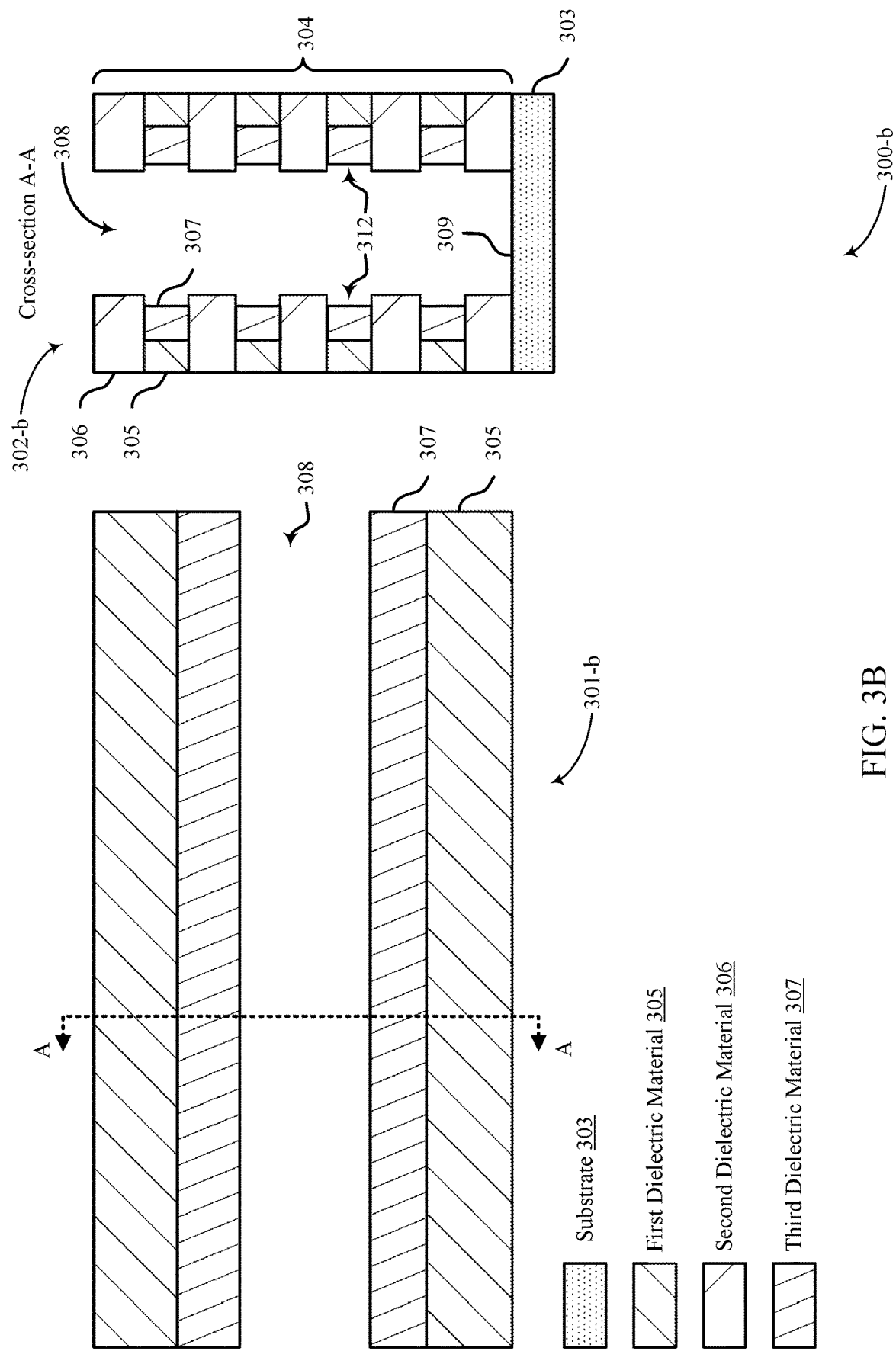
Figure 3C:
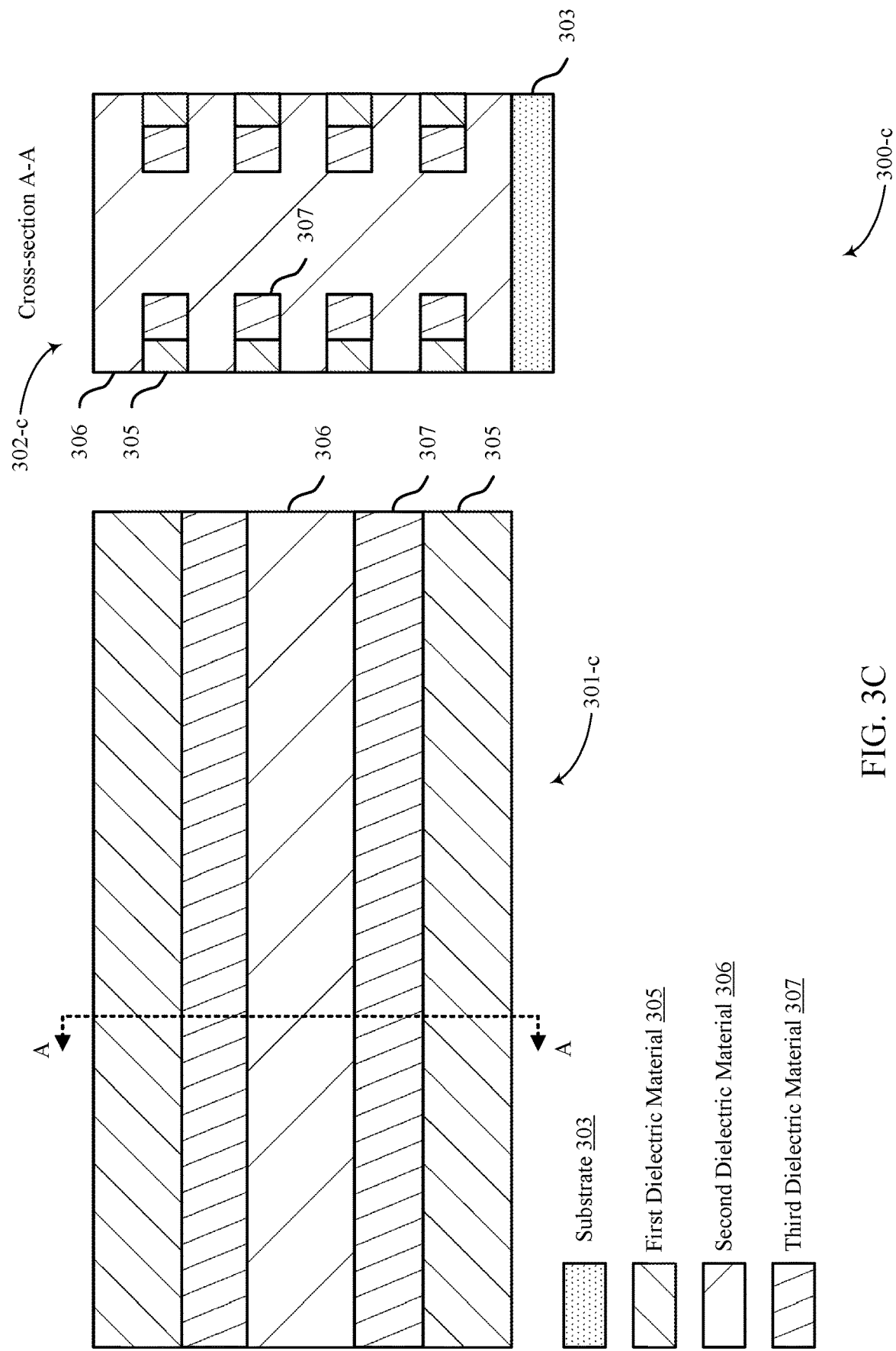
Figure 3D:
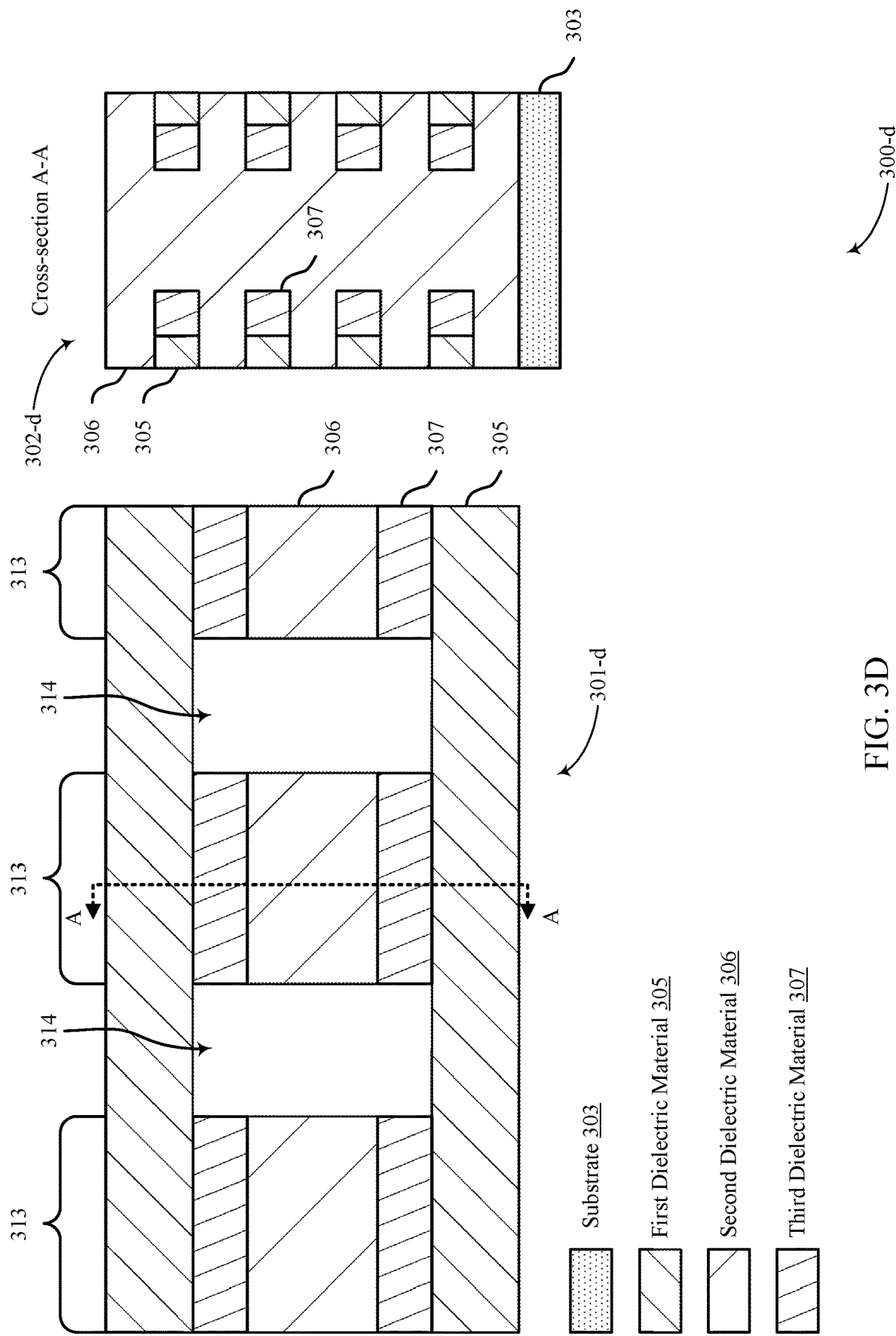
Figure 3E:
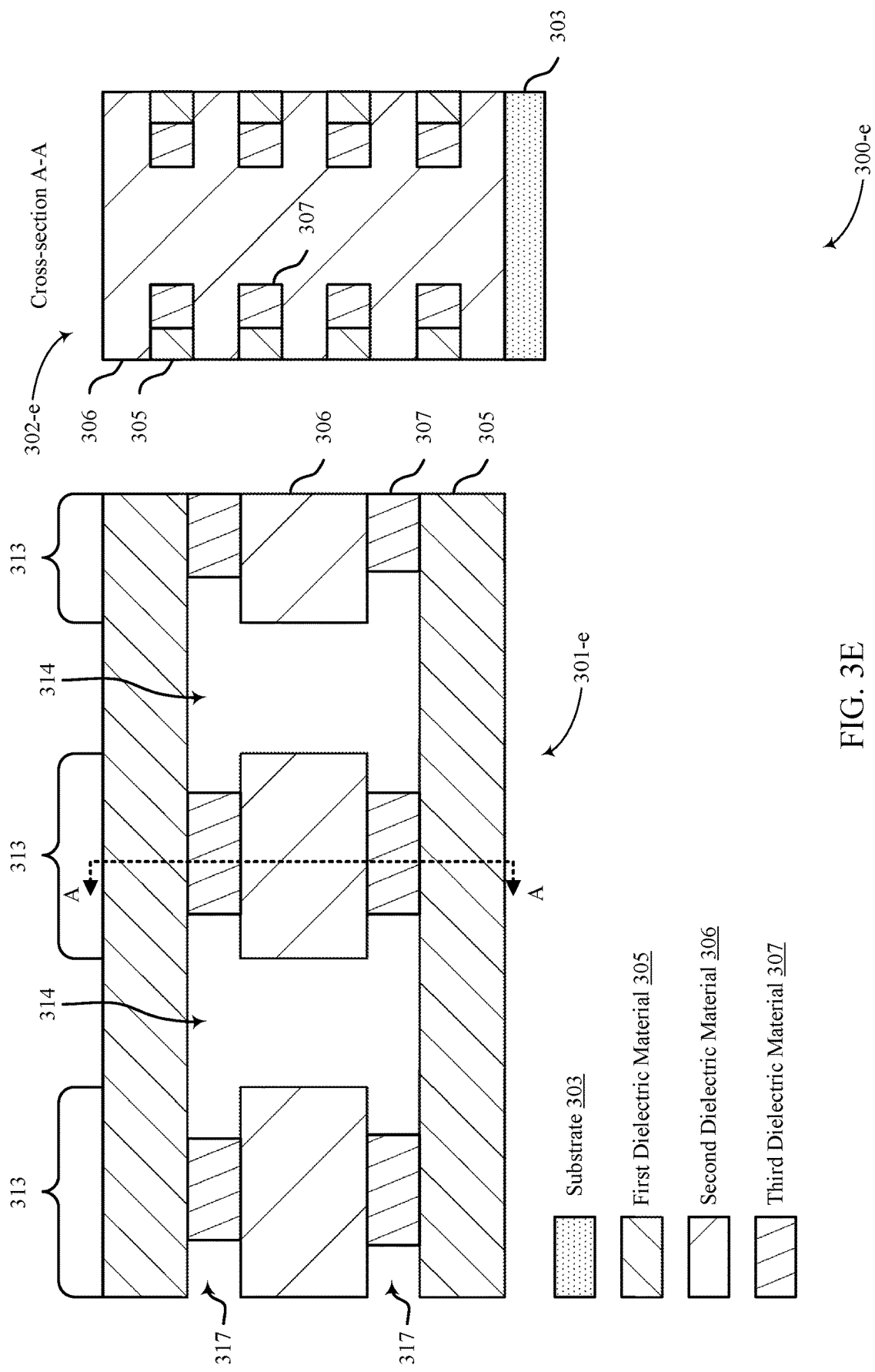
Figure 3F:
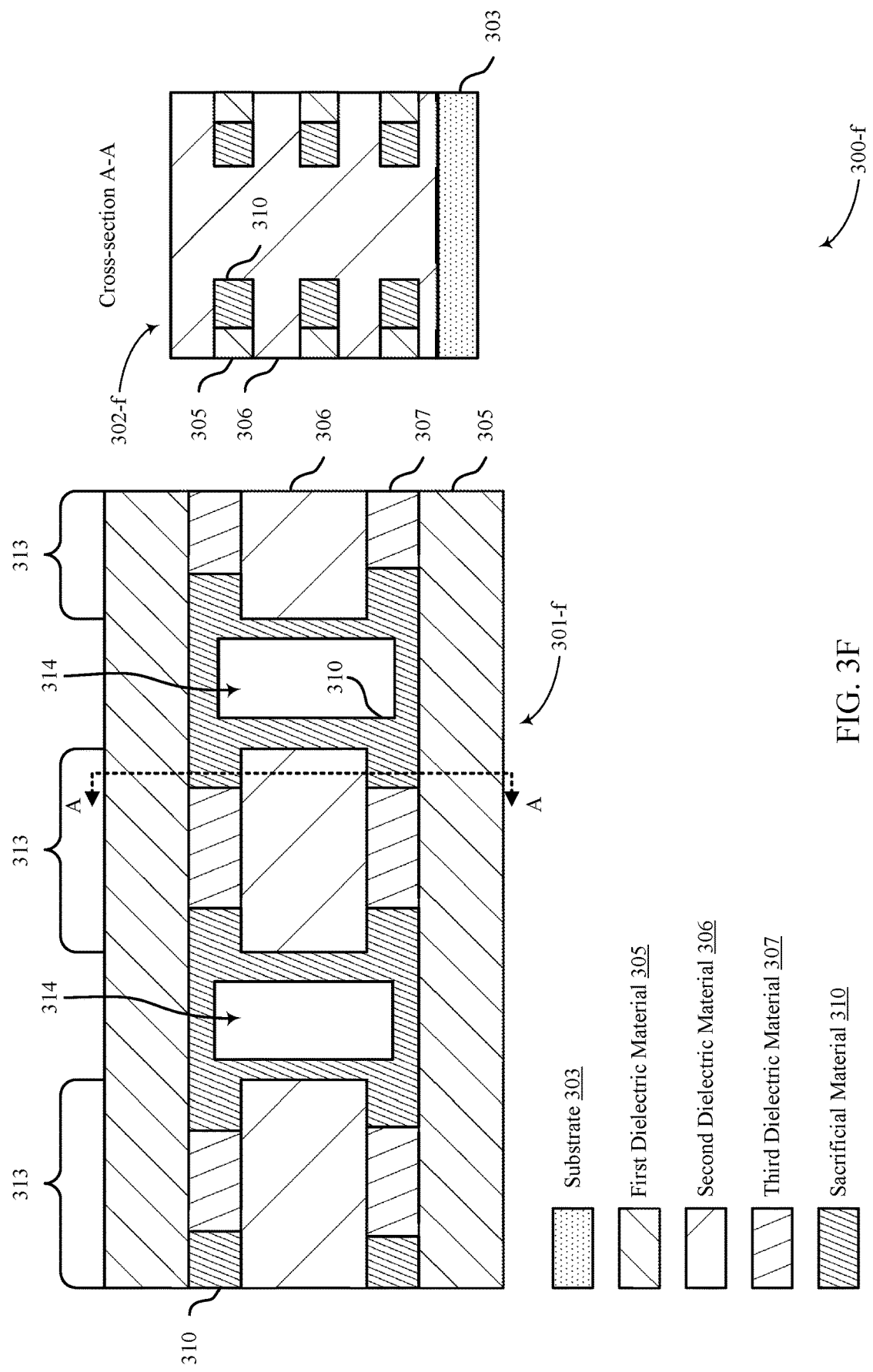
Figure 3G:
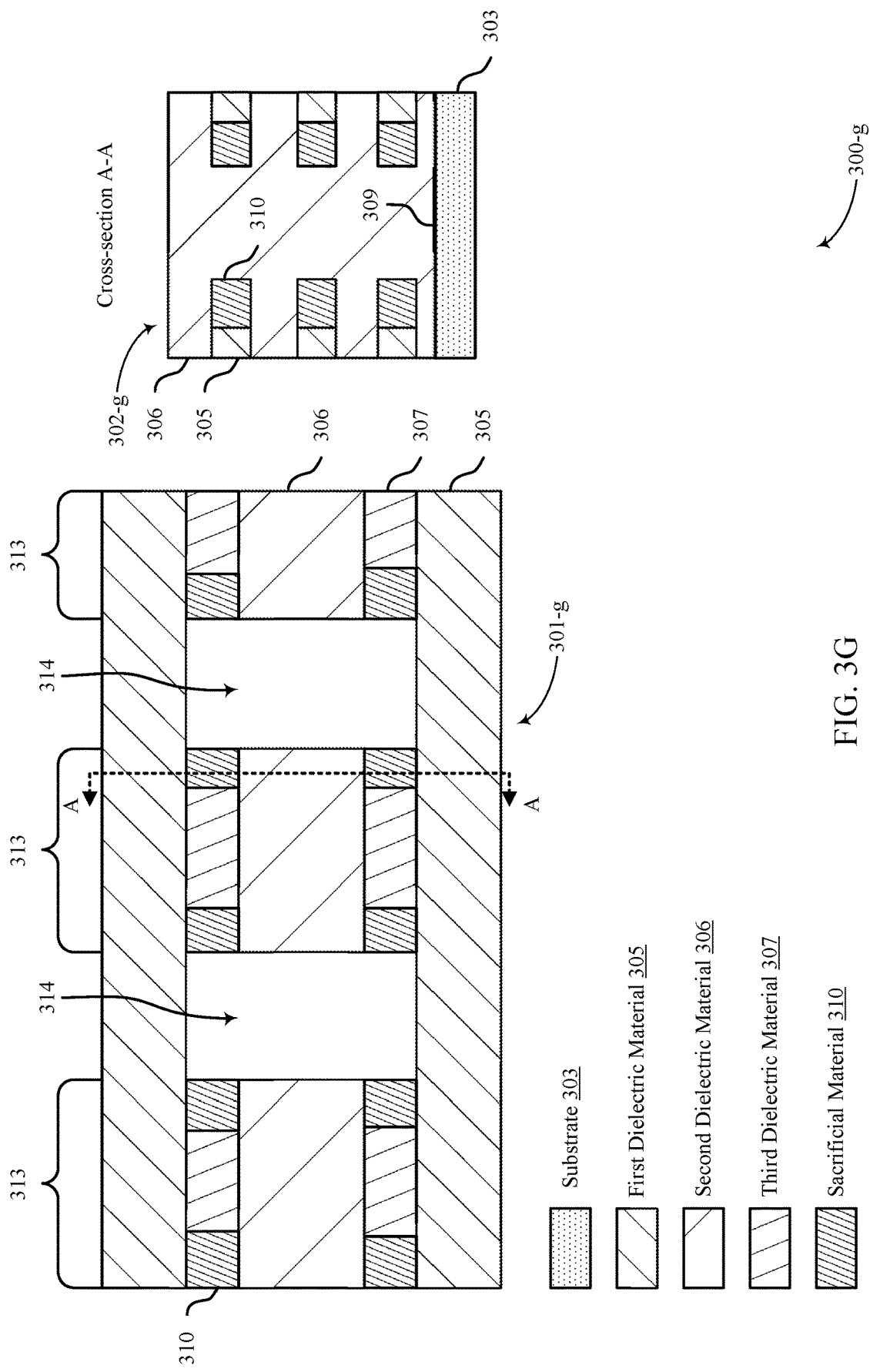
Figure 3H:
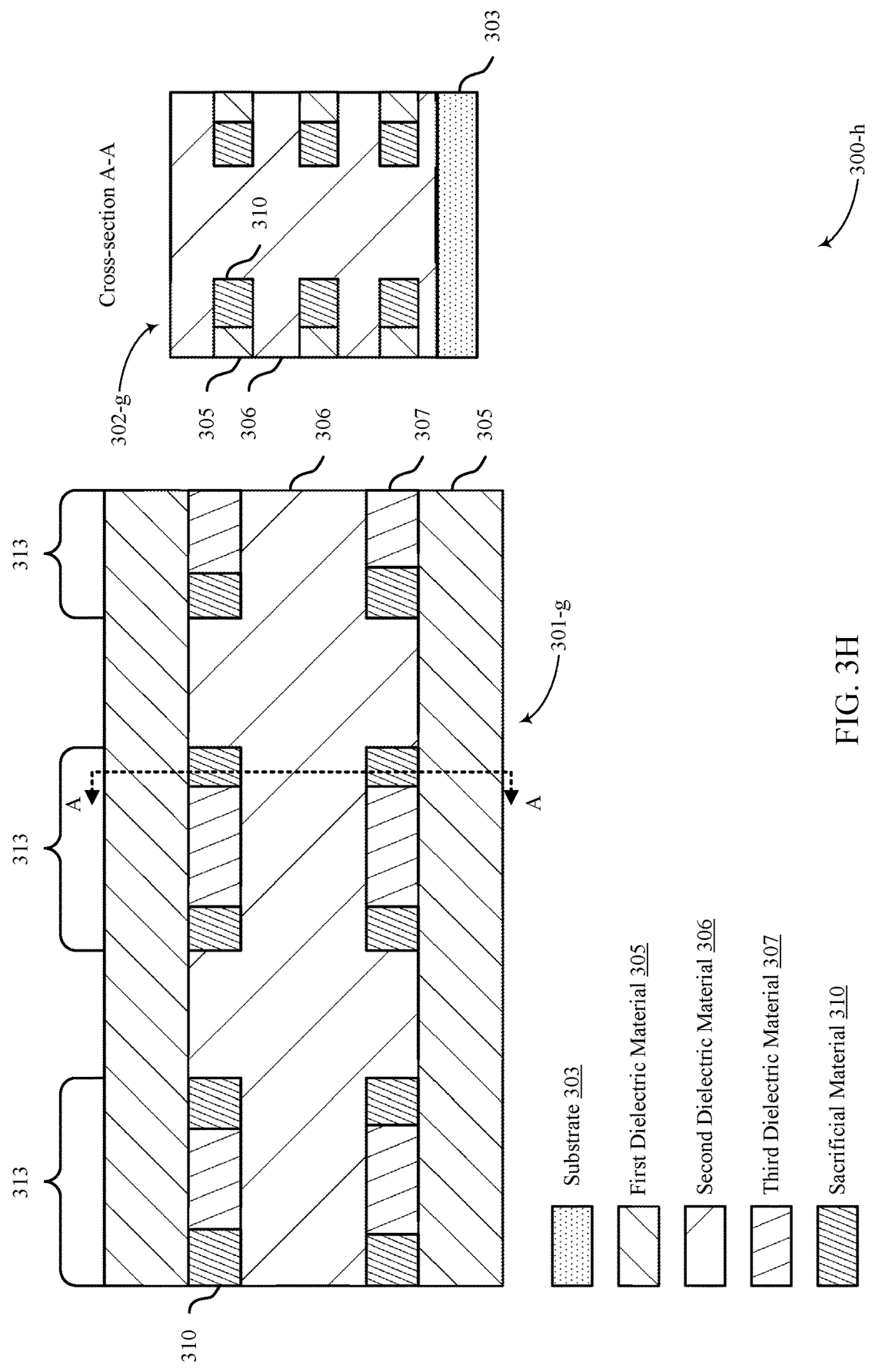
Figure 3I:
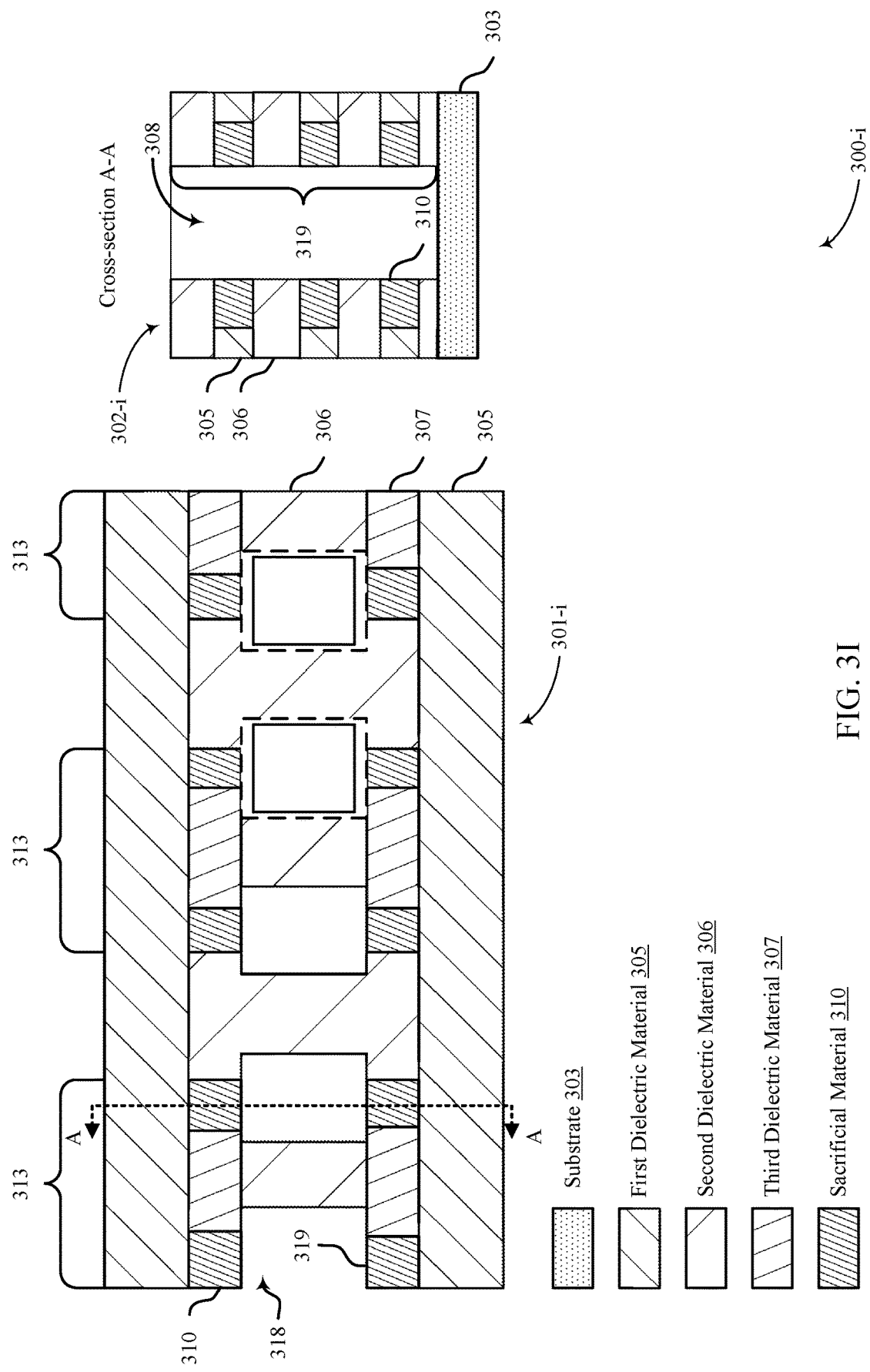
Figure 3J:
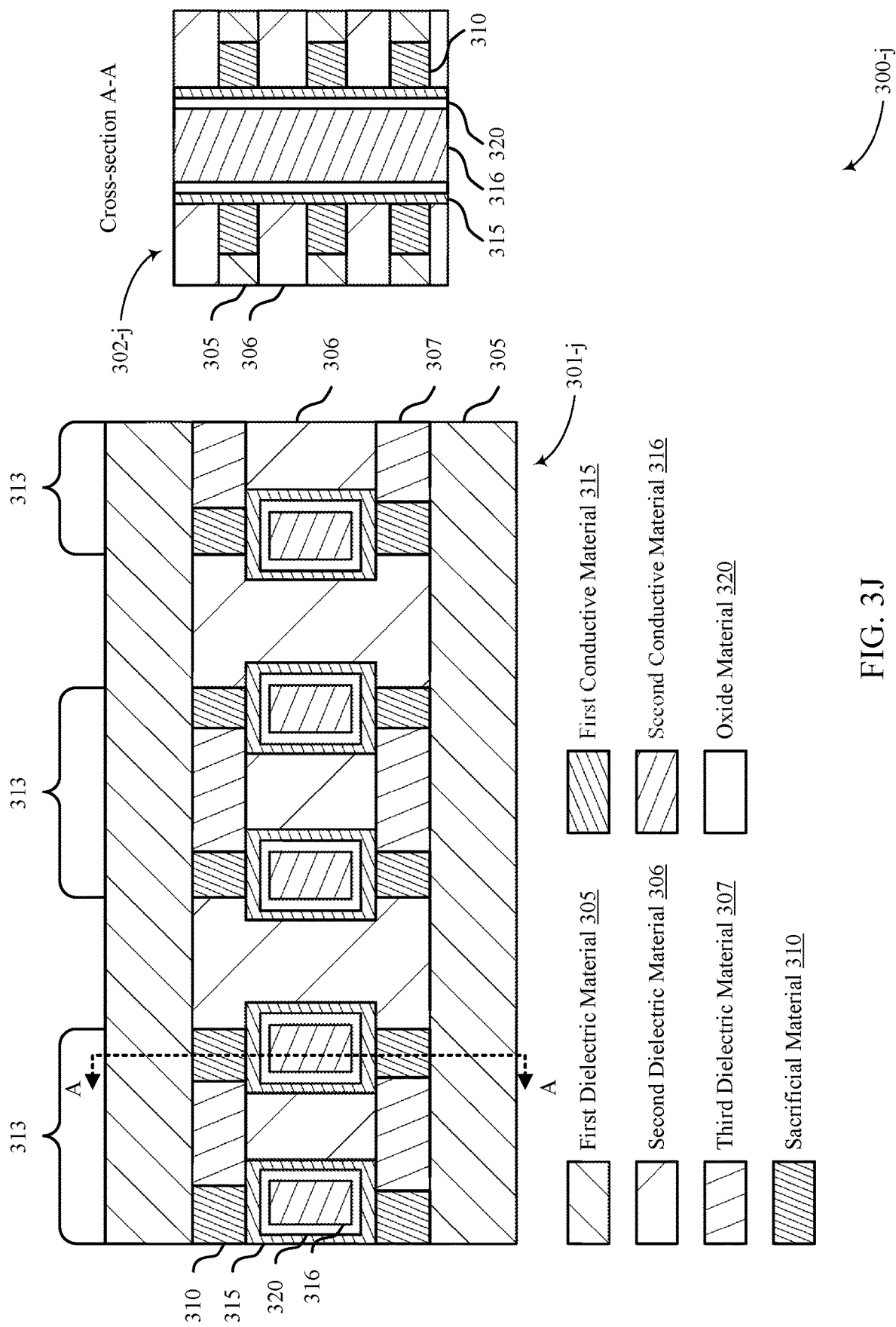
Figure 3K:
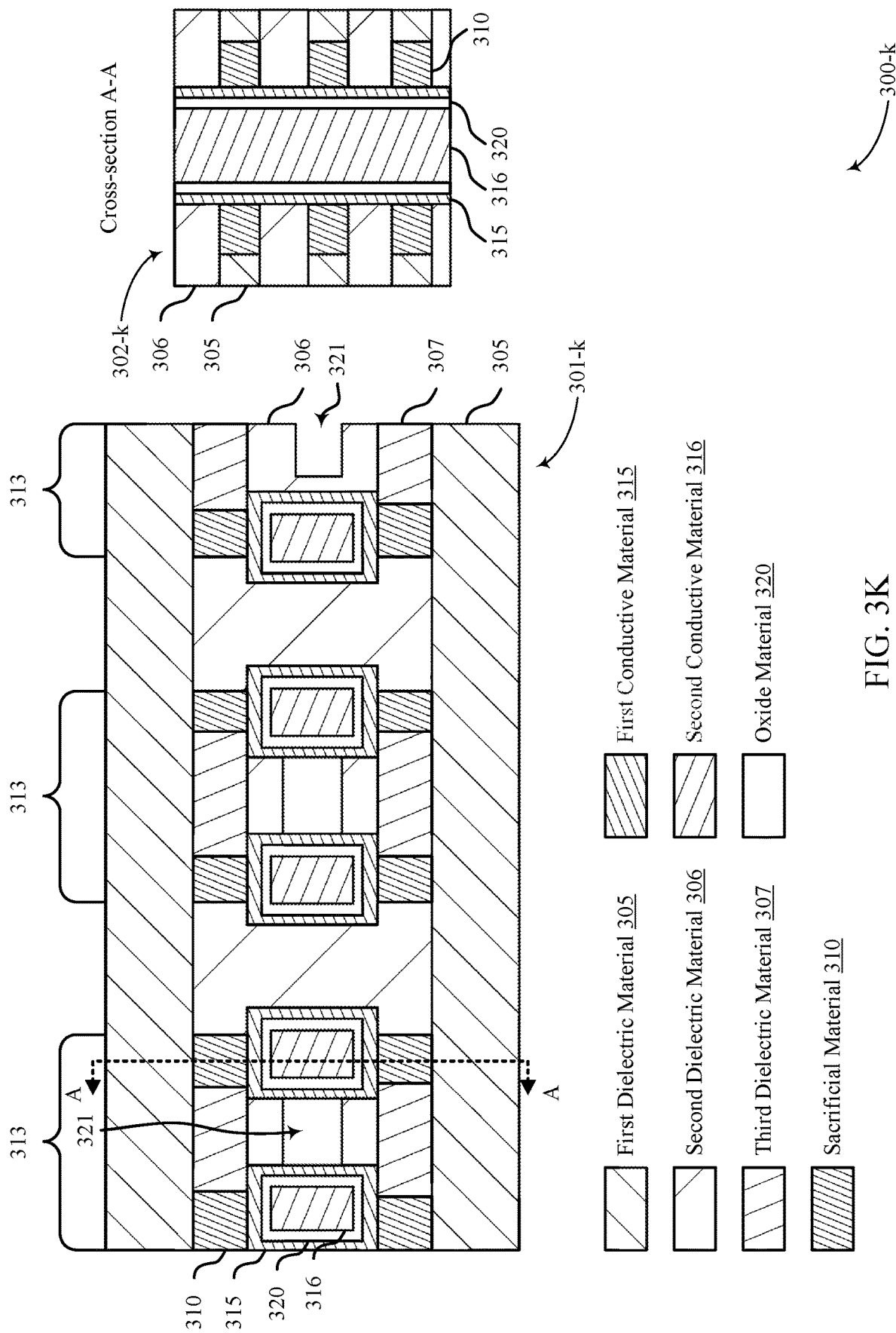
Figure 3L:
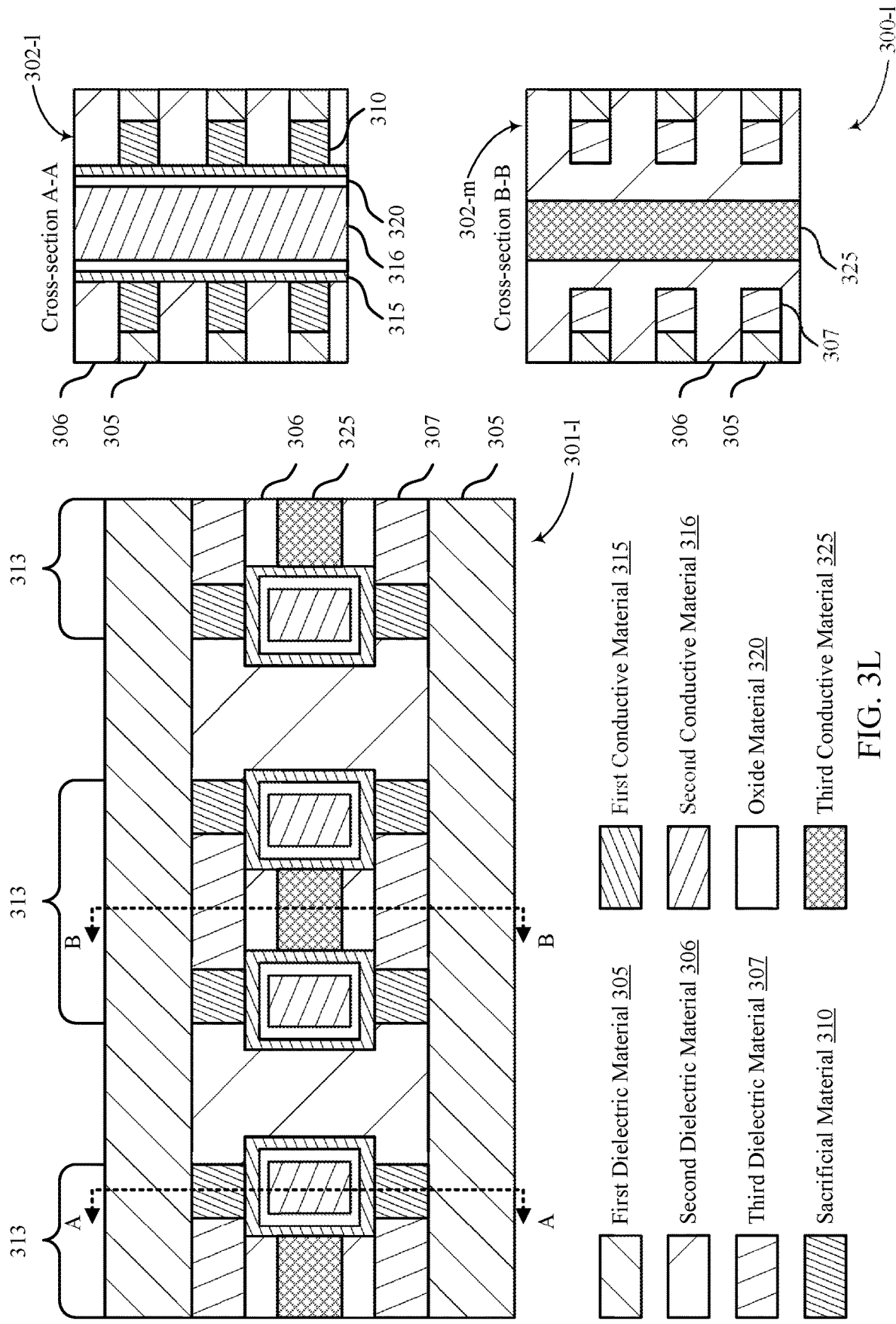
Figure 3M:
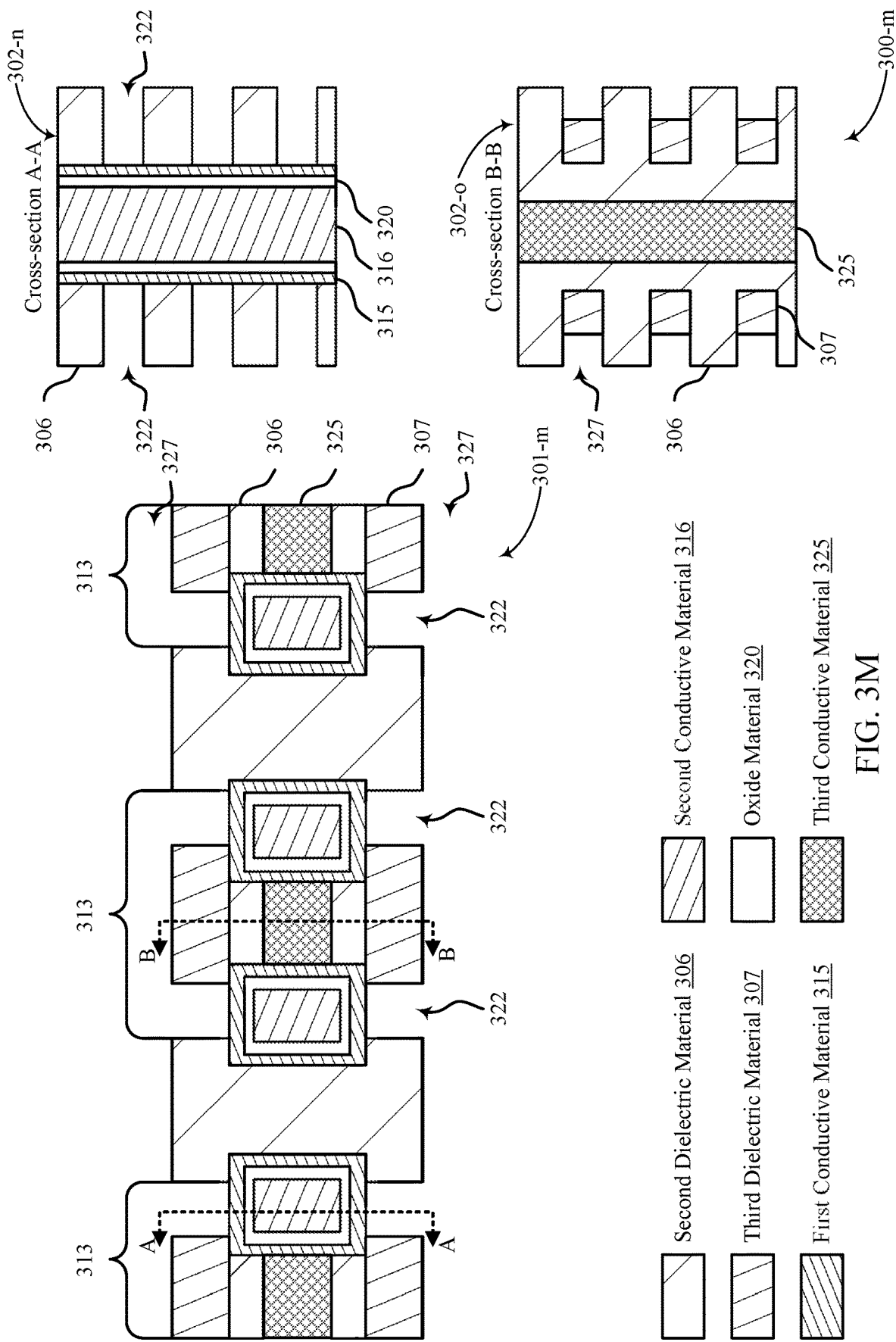
Figure 3N:
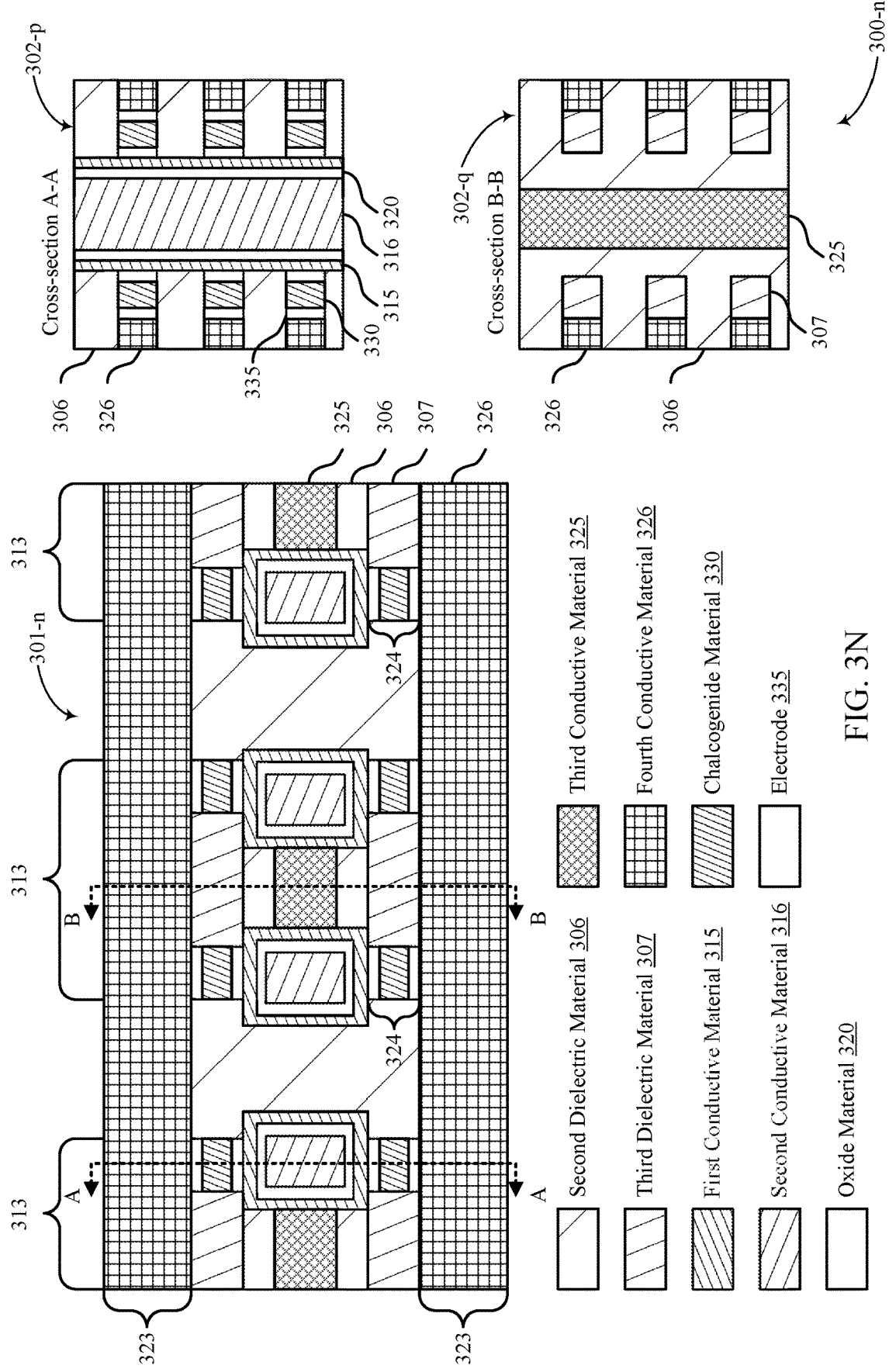

FIGS. 3A through 3N illustrate examples of processing steps 300 of a method for forming a vertical memory architecture (e.g., an architecture similar to a 3D vertical not-OR (NOR) flash memory architecture) in accordance with examples as disclosed herein. The processing steps illustrate various top planar views 301 and cross-sectional views 302 of materials on a substrate 303. Various cross-sections depicted FIGS. 3A through 3N are denoted by the corresponding line in related images on the same sheet.

In FIG. 3A, processing step 300-a is depicted and includes a top planar view 301-a of the memory architecture and a cross-sectional view 302-a of the memory architecture taken along the line A-A of the top planar view 301-a. In the processing step 300-a, a stack 304 of materials may be formed on the substrate 303. The stack 304 may include a first dielectric material 305 and a second dielectric material 306 in alternating layers. Any quantity of dielectric layers 305 and 306 may be layered based on a desired height of the vertical stack of memory cells. The stack 304 of materials (e.g., first dielectric material 305 and second dielectric material 306) may be etched to form a trench 308 and expose a surface 309 of the substrate 303 in the trench. Portions of the first dielectric material 305 may be etched to form cavities 311 between the alternating layers of the second dielectric material 306, as shown in the cross-sectional view 302-a of FIG. 3A. In some examples, the substrate 303 may be omitted from the top planar view 301-a for illustrative purposes.

In FIG. 3B, processing step 300-b is depicted and includes a top planar view 301-b of the memory architecture and a cross-sectional view 302-b of the memory architecture taken along the line A-A of the top planar view 301-b. In the processing step 300-b, a third dielectric material 307 may be deposited in the trench 308 and the cavities 311 between the alternating layers of the second dielectric material 306 to reform the stack 304 of materials. Portions of the third dielectric material 307 may be etched to reform the trench 308, expose the surface 309 of the substrate 303, and form cavities 312 between alternating layers of the second dielectric material 306, as shown in the cross-sectional view 302-b of FIG. 3B. In some examples, the substrate 303 may be omitted from the top planar view 301-b for illustrative purposes.

In FIG. 3C, processing step 300-c is depicted and includes a top planar view 301-c of the memory architecture and a cross-sectional view 302-c of the memory architecture taken along the line A-A of the top planar view 301-c. In the processing step 300-c, the second dielectric material 306 may be deposited to fill the trench 308, as shown in the cross-sectional view 302-c of FIG. 3C. In some examples, the substrate 303 may be omitted from the top planar view 301-c for illustrative purposes.

In FIG. 3D, processing step 300-d is depicted and includes a top planar view 301-d of the memory architecture and a cross-sectional view 302-d of the memory architecture taken along the line A-A of the top planar view 301-d. In the processing step 300-d, the second dielectric material 306 and the third dielectric material 307 may be etched to form pillars 313 separated by trenches 314, as shown in the top planar view 301-d of FIG. 3D. In some examples, the processing step 300-d may include a pillar dry etch process to form the pillars 313. In some examples, the substrate 303 may be omitted from the top planar view 301-d for illustrative purposes.

In FIG. 3E, processing step 300-e is depicted and includes a top planar view 301-e of the memory architecture and a cross-sectional view 302-e of the memory architecture taken along the line A-A of the top planar view 301-e. In the processing step 300-e, the third dielectric material 307 may be etched to form cavities 317 in the pillars 313, as shown in the top planar view 301-e of FIG. 3E. In some examples, the third dielectric material 307 may be etched using a controlled recession to remove a thickness (e.g., 20 nanometers (nm)) of the third dielectric material 307 from the pillars 313. In some cases, the controlled recession of the third dielectric material 307 may form the cavities 317 between alternating layers of the second dielectric material 306 parallel to the substrate 303 (similar to the cavities 311 and 312 shown and described with reference to FIGS. 3A and 3B, respectively). In some examples, the substrate 303 may be omitted from the top planar view 301-e for illustrative purposes.

In FIG. 3F, processing step 300-f is depicted and includes a top planar view 301-f of the memory architecture and a cross-sectional view 302-f of the memory architecture taken along the line A-A of the top planar view 301-f. In the processing step 300-f, a sacrificial material 310 (e.g., a placeholder material) may be deposited in the cavities 317 in the pillars 313 and in the trenches 314 between the pillars 313, as shown in the cross-sectional view 302-f of FIG. 3F. For example, the sacrificial material 310 may be deposited in the cavities 317 formed in the processing step 300-e. In some examples, the substrate 303 may be omitted from the top planar view 301-f for illustrative purposes.

In FIG. 3G, processing step 300-g is depicted and includes a top planar view 301-g of the memory architecture and a cross-sectional view 302-g of the memory architecture taken along the line A-A of the top planar view 301-g. In the processing step 300-g, portions of the sacrificial material 310 may be etched to reform the trenches 314 between the pillars 313 and expose the surface 309 of the substrate 303, leaving the sacrificial material 310 in the cavities 317 in the pillars 313, as shown in the cross-sectional view 302-g of FIG. 3G. In some examples, the substrate 303 may be omitted from the top planar view 301-g for illustrative purposes.

In FIG. 3H, processing step 300-h is depicted and includes a top planar view 301-h of the memory architecture and a cross-sectional view 302-h of the memory architecture taken along the line A-A of the top planar view 301-h. In the processing step 300-h, the second dielectric material 306 may be deposited to fill the trenches 314 between the pillars 313. In some examples, the substrate 303 may be omitted from the top planar view 301-h for illustrative purposes.

In FIG. 3I, processing step 300-i is depicted and includes a top planar view 301-i of the memory architecture and a cross-sectional view 302-i of the memory architecture taken along the line A-A of the top planar view 301-i. In the processing step 300-i, the second dielectric material 306 may be etched to form cavities 318 in the pillars 313. The cavities 318 may be positioned between the sacrificial material 310 such that at some of the sidewalls 319 of the cavities 318 are formed by the sacrificial material 310, as shown in the cross-sectional view 302-i of FIG. 3I. The etching process may align the cavities 318 with the sacrificial material 310 in the pillars 313. In some examples, the etching process may include a dry etch, a wet etch, a sequence of the dry etch and the wet etch, or any combination thereof. In some examples, the etch process may be performed with a wide tolerance in a first direction (e.g., an "X" direction of the top planar view 301-i) that is parallel to the substrate 303 and perpendicular to a second direction (e.g., a "Y" direction of the top planar view 301-i) in which the pillars 313 extend. Accordingly, the cavities 318 in the pillars 313 may have different widths in the first direction, but a same (or substantially the same) length in the second direction. In some examples, the substrate 303 may be omitted from the top planar view 301-i for illustrative purposes.

In FIG. 3J, processing step 300-j is depicted and includes a top planar view 301-j of the memory architecture and a cross-sectional view 302-j of the memory architecture taken along the line A-A of the top planar view 301-j. In the processing step 300-j, a first conductive material 315, a second conductive material 316, and an oxide material 320 may be deposited in the cavities 318 in the pillars 313. The first conductive material 315 may be deposited to form channels of selection elements, such as a channel that may selectively couple a storage element with a bit line decoder (e.g., a bit line decoder positioned above or below the memory architecture). In some examples, the first conductive material 315 may be a semiconductor material, such as polysilicon. The second conductive material 316 and the oxide material 320 may be deposited to form gates of the selection elements, such as a gate coupled with a word line decoder (e.g., a word line decoder positioned above or below the memory architecture). In some examples, the second conductive material 316 may include tungsten, polysilicon, or both. In some examples, the substrate 303 may be omitted from the top planar view 301-*j* and the cross-sectional view 302-*j* for illustrative purposes.

In FIG. 3K, processing step 300-*k* is depicted and includes a top planar view 301-*k* of the memory architecture and a cross-sectional view 302-*k* of the memory architecture taken along the line A-A of the top planar view 301-*k*. In the processing step 300-*k*, the second dielectric material 306 may be etched to form cavities 321 in the pillars 313. The etching process may align the cavities 321 between the depositions of the first conductive material 315 (e.g., between the polysilicon channels) in the pillars 313. In some examples, the etching process may include a dry etch, a wet etch, a sequence of the dry etch and the wet etch, or any combination thereof. In some examples, the etch process may be performed with a wide tolerance in the first direction (e.g., an "X" direction of the top planar view 301-*k*) that is parallel to the substrate 303 and perpendicular to a second direction (e.g., a "Y" direction of the top planar view 301-*k*) in which the pillars 313 extend. Accordingly, the cavities 321 in the pillars 313 may have different widths in the first direction, but a same (or substantially the same) length in the second direction. In some examples, the substrate 303 may be omitted from the top planar view 301-*k* and the cross-sectional view 302-*k* for illustrative purposes.

In FIG. 3L, processing step 300-*l* is depicted and includes a top planar view 301-*l* of the memory architecture, a cross-sectional view 302-*l* of the memory architecture taken along the line A-A of the top planar view 301-*l*, and a cross-sectional view 302-*m* of the memory architecture taken along the line B-B of the top planar view 301-*l*. In the processing step 300-*l*, a third conductive material 325 (e.g., tungsten) may be deposited in the cavities 321 in the pillars 313. The third conductive material 325 may be deposited to form source contacts of the selection elements, such as a source contact coupled with the bit line decoder. In some examples, the substrate 303 may be omitted from the top planar view 301-*l*, the cross-sectional view 302-*l*, and the cross-sectional view 302-*m* for illustrative purposes.

In FIG. 3M, processing step 300-*m* is depicted and includes a top planar view 301-*m* of the memory architecture, a cross-sectional view 302-*n* of the memory architecture taken along the line A-A of the top planar view 301-*m*, and a cross-sectional view 302-*o* of the memory architecture taken along the line B-B of the top planar view 301-*m*. In the processing step 300-*m*, the first dielectric material 305 and the sacrificial material 310 may be removed (e.g., etched) to prepare for forming the storage elements and plates. That is, the first dielectric material 305 may be removed to form trenches 327 extending in a first direction (e.g., an "X" direction of the top planar view 301-*m*), and the sacrificial material 310 may be removed to form cavities 322 in the pillars 313.

In FIG. 3N, processing step 300-*n* is depicted and includes a top planar view 301-*n* of the memory architecture, a cross-sectional view 302-*p* of the memory architecture taken along the line A-A of the top planar view 301-*n*, and a cross-sectional view 302-*q* of the memory architecture taken along the line B-B of the top planar view 301-*n*. In the processing step 300-*n*, storage elements 324 may be formed in the cavities 322 in the pillars 313 and plate lines 323 may be formed in the trenches 327 extending in the first direction. The plate lines 323 may include a fourth conductive material 326 (e.g., tungsten). In some examples, the plate lines 323 may be coupled with a plate decoder (e.g., a plate decoder positioned above or below the memory architecture). In some examples, the plate lines 323 may be isolated from one another, such as by depositing a dielectric material (e.g., the first dielectric material 305, the second dielectric material 306, or the third dielectric material 307) in the trenches 327. Each storage element 324 may include a chalcogenide material 330 between two electrodes 335. The chalcogenide material 330 may be deposited near the end of the formation process to avoid thermal stress on the chalcogenide material 330.

Figure 4:
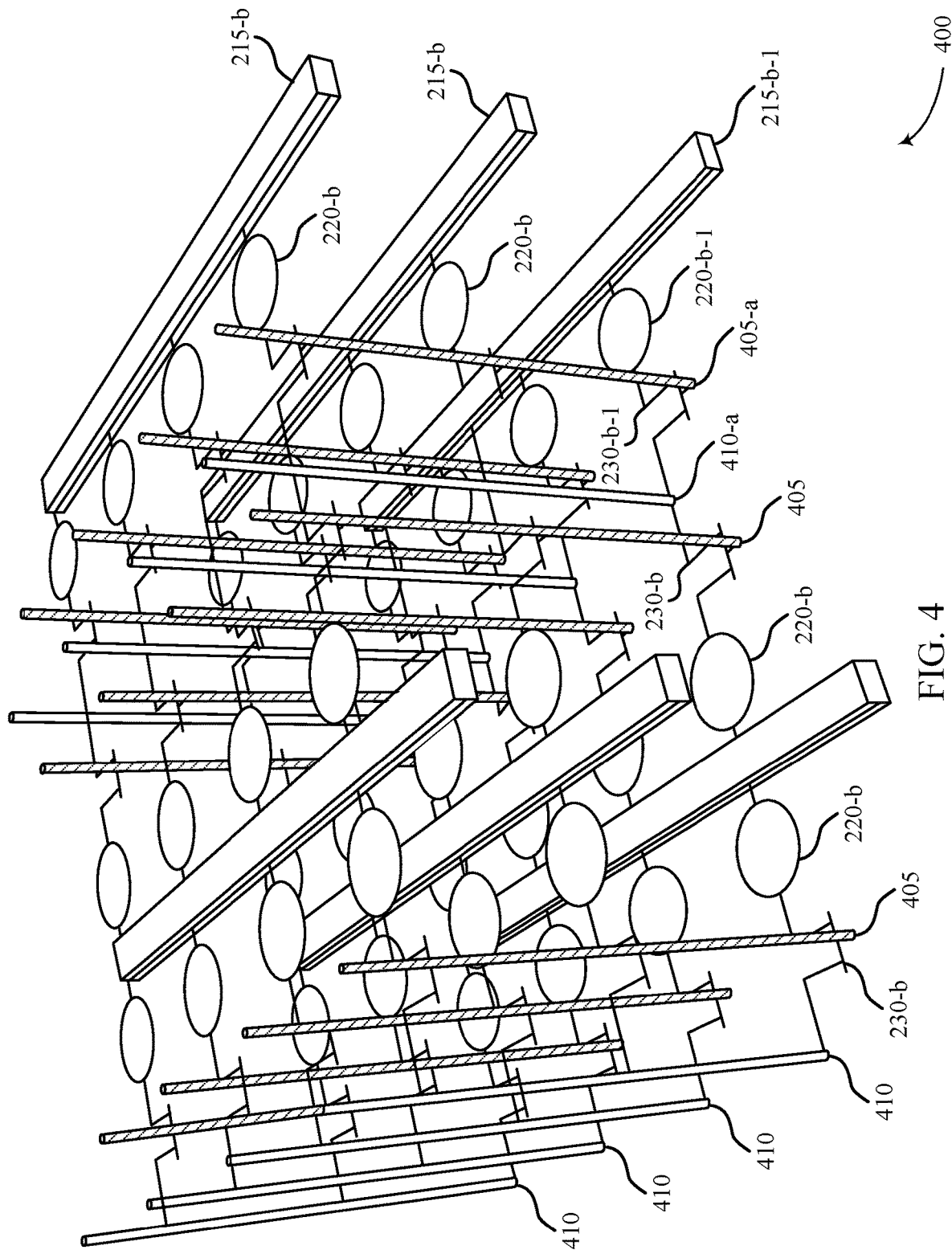
FIG. 4 illustrates an example of a circuit that supports a vertical memory architecture in accordance with examples as disclosed herein.

FIG. 4 illustrates an example of a circuit 500 that supports a vertical memory architecture in accordance with examples as disclosed herein. Components of the circuit 400 may be examples of the corresponding components described with reference to FIGS. 1 and 2. In some examples, the circuit 400 may implement the vertical memory architecture formed according to the processing steps 300 described with reference to FIGS. 3A-3N.

The circuit 400 may include a set of memory cells formed in planes on a substrate that may be positioned under the elements illustrated in the circuit 400. Each memory cell may include a storage element 220-*b* coupled with a selection element 230-*b*. Each storage element 220-*b* may be an example of a storage element 324 described with reference to FIG. 3N and may include a first terminal (e.g., a first electrode, such as an electrode 335 described with reference to FIG. 3N) coupled with a plate line 215-*b* of a set of plate lines 215-*b* that are parallel to the substrate. Each plate line 215-*b* may be an example of a plate line 323 described with reference to FIG. 3N.

Each selection element 230-*b* may be coupled with a word line pillar 405 and a bit line pillar 410, where a set of word line pillars 405 may be coupled with a word line decoder and a set of bit line pillars 410 may be coupled with a bit line decoder. The word line pillars 405 and the bit line pillars 410 may extend in a direction orthogonal to the substrate. In some examples, two selection elements 230-*b* (e.g., adjacent selection elements 230-*b* in a plane) may be coupled with a same bit line pillar 410. In some examples, each selection element 230-*b* may include a first conductive material, a second conductive material, and an oxide material, which may be examples of corresponding materials described with reference to FIGS. 3J-3N. In some examples, each selection element 230-*b* may include a transistor (e.g., a TFT, a MOSFET device, or another transistor device), where a gate contact of the transistor may be coupled with the word line pillar 405, a source contact of the transistor may be coupled with the bit line pillar 410, and a drain contact of the transistor may be coupled with a second terminal of the storage element 220-*b* (e.g., a second electrode, such as an electrode 335 described with reference to FIG. 3N).

Based on a voltage (e.g., an activation voltage for the transistor) applied via the word line pillar 405, the selection element 230-*b* may couple the bit line pillar 410 with the storage element 220-*b*. The storage element 220-*b* may include a chalcogenide material configured to store a logic state based on a polarity of a voltage applied to the chalcogenide material between the first and second terminals of the storage element 220-*b*. In some examples, the chalcogenide may have a first threshold voltage when the applied voltage has a first polarity and a second threshold voltage when the applied voltage has a second polarity. In some examples, the storage element 220-*b* may have a geometry (e.g., a thickness) or other material property (e.g., a bandgap of the chalcogenide material) that reduces (e.g., optimizes) a programming voltage of the storage element 220-*b*. In some examples, the activation voltage applied via the word line pillar 405 may be less than a magnitude of the first threshold voltage and less than a magnitude of the second threshold voltage, and accordingly an energy to program (e.g., energy-per-bit) a storage element 220-*b* in the circuit 400 may be less than an energy to program a storage element in other memory architectures, such as a 3D cross-point memory architecture.

The circuit 400 may be coupled with additional circuitry (e.g., a memory controller) configured to write or read logic states stored in the storage elements 220-*b*. For example, the circuit 400 illustrates a memory cell that includes a storage element 220 that is chalcogenide-based coupled with a selection element 230. Such a structure of a memory cell may be configured to reduce an activation voltage used to access the storage element 220 and thereby reduce the energy used to access the memory cell. Additionally, the bit lines pillars 410, word lines pillars 405, and plate lines 215 may be arranged in a manner to facilitate such a memory cell configuration. A logic state may be written to a target storage element 220-*b*-1 based on setting a plate line 215-*b*-1 to a first voltage, setting a bit line pillar 410-*a* to a second voltage, and setting a word line pillar 405-*a* to an activation voltage of a selection element 230-*b*-1. The logic state may be a first logic state (e.g., a logic "0" state) when the first voltage is greater than the second voltage, and a second logic state (e.g., a logic "1" state) when the first voltage is less than the second voltage. Additionally or alternatively, a read voltage may be applied between the plate line 215-*b*-1 and the bit line pillar 410-*a* to determine a logic state stored at the storage element 220-*b*-1. For example, the logic state may be determined based on a current (e.g., a direction of the current, a magnitude of the current, or another parameter) through the chalcogenide material of the storage element 220-*b*-1 responsive to the read voltage. In some examples, parallel access operations may be performed at the circuit 400, for example by concurrently selecting more than one word line pillar 405, concurrently selecting more than one bit line pillar 410, or both.

Figure 5:
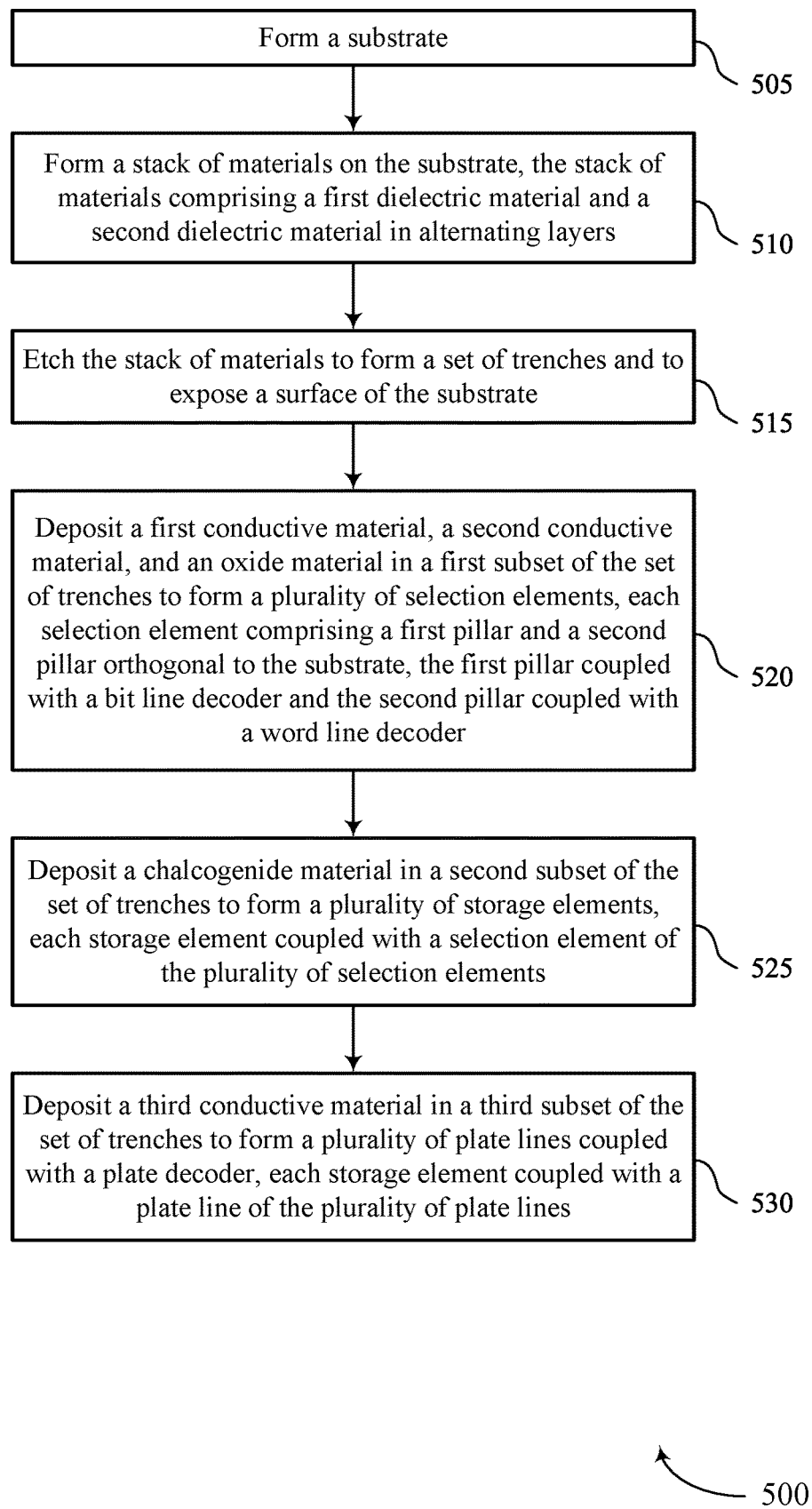
FIG. 5 shows a flowchart illustrating a method or methods that support a vertical memory architecture in accordance with examples as disclosed herein.

FIG. 5 shows a flowchart illustrating a method 500 that supports a vertical memory architecture in accordance with examples as disclosed herein. The operations of method 500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 505, the method may include forming a substrate. The operations of 505 may be performed according to the methods described here.

At 510, the method may include forming a stack of materials on the substrate, the stack of materials including a first dielectric material and a second dielectric material in alternating layers. The operations of 510 may be performed according to the methods described herein.

At 515, the method may include etching the stack of materials to form a set of trenches and to expose a surface of the substrate. The operations of 515 may be performed according to the methods described herein.

At 520, the method may include depositing a first conductive material, a second conductive material, and an oxide material in a first subset of the set of trenches to form a plurality of selection elements, each selection element including a first pillar and a second pillar orthogonal to the substrate, the first pillar coupled with a bit line decoder and the second pillar coupled with a word line decoder. The operations of 520 may be performed according to the methods described herein.

At 525, the method may include depositing a chalcogenide material in a second subset of the set of trenches to form a plurality of storage elements, each storage element coupled with a selection element of the plurality of selection elements. The operations of 525 may be performed according to the methods described herein.

At 530, the method may include depositing a third conductive material in a third subset of the set of trenches to form a plurality of plate lines coupled with a plate decoder, each storage element coupled with a plate line of the plurality of plate lines. The operations of 530 may be performed according to the methods described herein.

In some examples, an apparatus (e.g., a manufacturing system) as described herein may perform a method or methods, such as the method 500. The apparatus may include features, circuitry, logic, means, or instructions (e.g., a set of instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a substrate; forming a stack of materials on the substrate, the stack of materials including a first dielectric material and a second dielectric material in alternating layers; etching the stack of materials to form a set of trenches and to expose a surface of the substrate; depositing a first conductive material, a second conductive material, and an oxide material in a first subset of the set of trenches to form a plurality of selection elements, each selection element including a first pillar and a second pillar orthogonal to the substrate, the first pillar coupled with a bit line decoder and the second pillar coupled with a word line decoder; depositing a chalcogenide material in a second subset of the set of trenches to form a plurality of storage elements, each storage element coupled with a selection element of the plurality of selection elements; and depositing a third conductive material in a third subset of the set of trenches to form a plurality of plate lines coupled with a plate decoder, each storage element coupled with a plate line of the plurality of plate lines.

Aspect 2: The method or apparatus of aspect 1, further including operations, features, circuitry, logic, means, or instructions, or any combination thereof for depositing a sacrificial material in the first subset of the set of trenches and the second subset of the set of trenches based at least in part on etching the stack of materials and etching the sacrificial material to reform the first subset of the set of trenches, where depositing the first conductive material, the second conductive material, and the oxide material is based at least in part on etching the sacrificial material.

Aspect 3: The method or apparatus of aspect 2, further including operations, features, circuitry, logic, means, or instructions, or any combination thereof for depositing the second dielectric material in the first subset of the set of trenches based at least in part on etching the sacrificial material and etching the second dielectric material to form cavities in the first subset of the set of trenches centered on the sacrificial material in the second subset of the set of trenches, where the first conductive material, the second conductive material, and the oxide material are deposited in the cavities to form the plurality of selection elements.

Aspect 4: The method or apparatus of any of aspects 2 through 3, further including operations, features, circuitry, logic, means, or instructions, or any combination thereof for etching the sacrificial material to reform the second subset of the set of trenches based at least in part on forming the plurality of selection elements, where the chalcogenide material is deposited in the second subset of the set of trenches based at least in part on etching the sacrificial material.

Aspect 5: The method or apparatus of any of aspects 1 through 4, further including operations, features, circuitry, logic, means, or instructions, or any combination thereof for depositing a fourth conductive material in the first subset of the set of trenches to form a plurality of source contacts, each selection element including a source contact.

Aspect 6: The method or apparatus of any of aspects 1 through 5, further including operations, features, circuitry, logic, means, or instructions, or any combination thereof for depositing a fourth conductive material in the second subset of the set of trenches to form a first plurality of electrodes and a second plurality of electrodes, each storage element contacting a first electrode of the first plurality of electrodes and a second electrode of the second plurality of electrodes.

Aspect 7: The method or apparatus of aspect 6 where each electrode of the first plurality of electrodes contacts a selection element of the plurality of selection elements and each electrode of the second plurality of electrodes contacts a plate line of the plurality of plate lines.

Aspect 8: The method or apparatus of any of aspects 1 through 7 where an activation voltage of each selection element is less than a threshold voltage of the chalcogenide material.

Aspect 9: The method or apparatus of any of aspects 1 through 8 where a channel of each selection element includes the first conductive material and is coupled with a bit line via a source contact and a gate contact of each selection element includes the second conductive material in contact with the oxide material and is coupled with a word line.

Aspect 10: The method or apparatus of any of aspects 1 through 9 where the first conductive material includes tungsten, polysilicon, or both and the second conductive material includes tungsten, polysilicon, or both.

It should be noted that the methods described above describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus, including: a substrate; a storage element including a chalcogenide material coupled with a plate decoder; and a selection element coupled with the storage element, the selection element including a first pillar and a second pillar orthogonal to the substrate, the first pillar coupled with a bit line decoder and the second pillar coupled with a word line decoder.

Aspect 12: The apparatus of aspect 11, further including: a plate line coupled with an electrode of the storage element, the storage element coupled with the plate decoder via the plate line.

Aspect 13: The apparatus of any of aspects 11 through 12, where the storage element is coupled with the selection element via an electrode.

Aspect 14: The apparatus of any of aspects 11 through 13, where an activation voltage of the selection element is less than a threshold voltage of the chalcogenide material.

Aspect 15: The apparatus of any of aspects 11 through 14, where: the first pillar is a source contact including a first conductive material; and the second pillar is a gate contact including a second conductive material coupled with an oxide material.

Aspect 16: The apparatus of any of aspects 11 through 15, where the selection element includes a transistor.

Aspect 17: The apparatus of aspect 16, where the storage element is coupled with a drain of the transistor.

An apparatus is described. The following provides an overview of aspects of the apparatus as described herein:

Aspect 18: An apparatus, including: a first pillar of a memory array including a source contact of a selection element, the source contact coupled with a bit line; and a second pillar of the memory array including: a first storage element including a chalcogenide material; a second storage element including the chalcogenide material; a channel of the selection element between the first storage element and the second storage element, the channel coupled with a first electrode of the first storage element and a second electrode of the second storage element; and a gate contact of the selection element configured to selectively couple the first storage element, the second storage element, or both, with the bit line via the source contact based at least in part on a voltage of a word line coupled with the gate contact.

Aspect 19: The apparatus of aspect 18, further including: a first plate line coupled with the first storage element; and a second plate line coupled with the second storage element.

Aspect 20: The apparatus of any of aspects 18 through 19, where the selection element includes a transistor.

Aspect 21: The apparatus of aspect 20, where the first storage element and the second storage element are coupled with a drain of the transistor.

Aspect 22: The apparatus of any of aspects 18 through 21, further including: a third pillar of the memory array including: a third storage element including the chalcogenide material; a fourth storage element including the chalcogenide material; a second channel of a second selection element between the third storage element and the fourth storage element, the second channel coupled with a third electrode of the third storage element and a fourth electrode of the fourth storage element; and a second gate contact of the second selection element configured to selectively couple the third storage element, the fourth storage element, or both, with the bit line via the source contact based at least in part on a second voltage of a second word line coupled with the second gate contact.

Aspect 23: The apparatus of aspect 22, where the second selection element further includes the source contact of the first pillar.

Aspect 24: The apparatus of any of aspects 18 through 23, where an activation voltage of the selection element is less than a threshold voltage of the chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) may not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   forming a substrate;
   forming a stack of materials on the substrate, the stack of materials comprising a first dielectric material and a second dielectric material in alternating layers;
   etching the stack of materials to form a set of trenches and to expose a surface of the substrate;
   depositing a first conductive material, a second conductive material, and an oxide material in a first subset of the set of trenches to form a plurality of selection elements, each selection element comprising a first pillar and a second pillar orthogonal to the substrate, the first pillar coupled with a bit line decoder and the second pillar coupled with a word line decoder;
   depositing a chalcogenide material in a second subset of the set of trenches to form a plurality of storage elements, each storage element coupled with a selection element of the plurality of selection elements; and
   depositing a third conductive material in a third subset of the set of trenches to form a plurality of plate lines coupled with a plate decoder, each storage element coupled with a plate line of the plurality of plate lines.

2. The method of claim 1, further comprising:
   depositing a sacrificial material in the first subset of the set of trenches and the second subset of the set of trenches based at least in part on etching the stack of materials; and
   etching the sacrificial material to reform the first subset of the set of trenches, wherein depositing the first conductive material, the second conductive material, and the oxide material is based at least in part on etching the sacrificial material.

3. The method of claim 2, further comprising:
   depositing the second dielectric material in the first subset of the set of trenches based at least in part on etching the sacrificial material; and
   etching the second dielectric material to form cavities in the first subset of the set of trenches centered on the sacrificial material in the second subset of the set of trenches, wherein the first conductive material, the second conductive material, and the oxide material are deposited in the cavities to form the plurality of selection elements.

4. The method of claim 2, further comprising:
   etching the sacrificial material to reform the second subset of the set of trenches based at least in part on forming the plurality of selection elements, wherein the chalcogenide material is deposited in the second subset of the set of trenches based at least in part on etching the sacrificial material.

5. The method of claim 1, further comprising:
   depositing a fourth conductive material in the first subset of the set of trenches to form a plurality of source contacts, each selection element comprising a source contact.

6. The method of claim 1, further comprising:
   depositing a fourth conductive material in the second subset of the set of trenches to form a first plurality of electrodes and a second plurality of electrodes, each storage element contacting a first electrode of the first plurality of electrodes and a second electrode of the second plurality of electrodes.

7. The method of claim 6, wherein:
each electrode of the first plurality of electrodes contacts a selection element of the plurality of selection elements; and
each electrode of the second plurality of electrodes contacts a plate line of the plurality of plate lines.

8. The method of claim 1, wherein an activation voltage of each selection element is less than a threshold voltage of the chalcogenide material.

9. The method of claim 1, wherein:
a channel of each selection element comprises the first conductive material and is coupled with a bit line via a source contact; and
a gate contact of each selection element comprises the second conductive material in contact with the oxide material and is coupled with a word line.

10. The method of claim 1, wherein:
the first conductive material comprises tungsten, polysilicon, or both; and
the second conductive material comprises tungsten, polysilicon, or both.

* * * * *